United States Patent [19]

Ukai et al.

[11] Patent Number: 5,282,229
[45] Date of Patent: Jan. 25, 1994

[54] METHOD AND APPARATUS FOR MEASURING GAP BETWEEN ADJOINING FUEL RODS OF FUEL ASSEMBLY

[75] Inventors: Masaru Ukai, Kawasaki; Hideaki Okami, Chigasaki; Kozo Sato, Yokohama; Kazuya Okamoto, Yono, all of Japan

[73] Assignee: Kabushiki Kaisha Toshiba, Kawasaki, Japan

[21] Appl. No.: 834,191

[22] Filed: Feb. 12, 1992

[30] Foreign Application Priority Data

| Feb. 15, 1991 | [JP] | Japan | 3-22407 |
| Dec. 16, 1991 | [JP] | Japan | 3-332253 |
| Jan. 28, 1992 | [JP] | Japan | 4-13282 |

[51] Int. Cl.$^5$ .............................................. G21C 17/00
[52] U.S. Cl. ........................................ 376/245; 376/247; 376/261
[58] Field of Search ........................ 376/245, 247, 261; 324/306, 307; 976/207, 214

[56] References Cited

U.S. PATENT DOCUMENTS

| 4,152,638 | 5/1979 | Kruger | 324/0.5 MA |
| 4,259,638 | 3/1981 | Krueger | 324/306 |
| 4,576,777 | 3/1986 | Weber | 376/153 |
| 4,816,207 | 3/1989 | Scharpenberg | 376/252 |
| 5,070,622 | 12/1991 | Butzin et al. | 33/793 |

Primary Examiner—Donald P. Walsh
Assistant Examiner—Meena Chelliah
Attorney, Agent, or Firm—Oblon, Spivak, McClelland, Maier & Neustadt

[57] ABSTRACT

A gap between adjoining fuel rods arranged in a fuel assembly is measured by setting a measuring device into a fluid such as cooling water or a specific gas such as CF filling a container, placing a fuel assembly to be inspected to a predetermined portion the container, measuring a distribution of the fluid distributed in the fuel assembly by utilizing a nuclear magnetic resonance imaging system, and measuring the gap in accordance with the fluid distribution as an image. The measuring device includes a magnet unit and a coil unit for generating magnetic fields, and the coil unit includes a coil assembly for generating gradient magnetic fields and a coil assembly for generating a high-frequency magnetic field and detecting a nuclear magnetic resonance signal. The gap measuring apparatus utilizing nuclear magnetic resonance further includes a controlling device for controlling the magnetic fields generated by the magnet unit and the coil assemblies and a data processor for carrying out data processing in response to a signal transmitted from the controlling device, wherein the distribution of the fluid in the fuel assembly is processed as a sectional image of the fuel assembly to thereby measure the gaps between adjoining fuel rods or between the fuel rod and the water rod.

31 Claims, 21 Drawing Sheets

METHOD AND APPARATUS FOR MEASURING GAP BETWEEN ADJOINING FUEL RODS OF FUEL ASSEMBLY

BACKGROUND OF THE INVENTION

The present invention relates to a method and apparatus for measuring a gap between adjoining fuel rods disposed in a fuel assembly and a gap between an adjoining fuel rod and water rod disposed therein; and more particularly to the method and apparatus wherein fluid, such as cooling water or specific gas, distribution can be precisely obtained for a short time from a tomographied image of the fuel assembly utilizing a nuclear magnetic resonance phenomenon to thereby measure the gap between the adjoining fuel rods as an image These gaps will be inclusively referred to herein as a gap between the fuel rods as far as no problem is raised.

Usually, a nuclear reactor has a reactor core into which a plurality of fuel assemblies are charged, and a typical one example of one of such fuel assembly is shown in FIG. 33, which represents a fuel assembly to be charged into a reactor of a boiling water type nuclear reactor.

Referring to FIG. 33, a fuel assembly 1 comprises a square cylindrical channel box 2 in which a plurality of fuel rods 3 and at least one water rod are supported in lattice in cross section with spaces with each other by spacers 4. Both upper and lower end portions of each of the fuel rods 3 are secured in an assembled state to upper and lower tie plates 5 and 6. The gaps between the adjoining fuel rods 3 and between the adjoining fuel rod 3 and water rod are supported by the spacers 4, and in an arrangement of the fuel assembly 1 in which the fuel rods 3 of 8 rows and 8 column lattice are charged, each gap is small, 4 mm for example.

It is significant to form gaps between the fuel rods 3 for transferring heat from the surfaces of the fuel rods to the coolant. In a case where the gap is below a certain predetermined value, this heat transfer phenomenon transits from a nucleate boiling phenomenon having good heat transferring property to a film boiling phenomenon having bad heat transferring property, which may result in an excessive increasing of a surface temperature of a fuel cladding. Because of such reason, inspection of the gaps between the fuel rods in the fuel assembly is performed to ensure the proper gap is maintained at a time of periodical inspection generally carried out after about one year running of a nuclear power plant or at a time of manufacturing the fuel assembly.

Namely, the nuclear power plant is generally subjected to the periodical inspection for about three months after about one year operation, and in such periodical inspection, respective equipments are inspected and nuclear fuel is exchanged with new fuel. For instance, with a boiling water type reactor, including 764 fuel assemblies, having output power of about 1.1 milion kw, about one fourth of the fuel assemblies is exchanged with new ones and the remaining three fourths thereof is continuously used. The fuel assemblies to be exchanged are herein called spent fuel and the remaining fuel assembles which are not changed are called re-charged fuel.

Sampling inspection is performed by sampling predetermined number of spent fuels and the re-charged fuels in accordance with every design type of the fuel assemblies. The sampling inspection includes an outer appearance inspection of the fuel assemblies and an inspection of a gap between the adjoining fuel rods. The gap measuring method in such sampling inspection will be described hereunder with reference to FIG. 34.

FIG. 34 shows a brief arrangement in cross section of a fuel assembly 1, taken along the line XXXIV—XXXIV in FIG. 33, including 62 fuel rods 3 and two water rods 7 arranged centrally in the arrangement forming a lattice of 8 rows and 8 columns.

In the prior art, a method of measuring a gap between the adjoining fuel rods is performed by positioning a light source to an A side, for example, observing the light passing the gaps between the fuel rods 3 on a C side opposing to the A side as shown in FIG. 34 by means of a submerged camera, for example, and observing a light generated from a light source positioned to a B side and passing the gaps between the fuel rods 3 on a D side opposing to the B side also by means of the submerged camera. These lights are therefore projected in crossing directions to each other with the right angle. This method for observing the gaps between fuel rods is called herein a light projection method for the sake of convenience.

In a case where it is observed by the light projection method that the gaps between the fuel rods become considerably narrow, a feeler gauge of a plate gauge structure having known thickness is inserted into the gap to observe the condition thereof. This method is called a feeler gauge method.

In these days, it is required to make a high degree of burnup of the fuel assembly for the purpose of improving fuel economy and hence to develop a new type fuel. In order to make high the degree of burnup, it will be necessary to sample data of neutron irradiation character in the fuel assembly and to reflect the data to the design of the fuel assembly. Although it is desired that the data includes sampling data regarding the gap between the fuel rods of the fuel assembly, the above mentioned light projection method and feeler gauge method are not sufficient. That is, in these methods, a lot of feeler gauges are required in order to obtain a required accuracy of the measured gap data, and for example, when the accuracy of order of 0.05 mm is required, 50 plate gauges will be required. Moreover, in the case of measuring the spent fuel assembly, a remote control operation with a distance about 5 m in submerged condition will be required because the fuel assembly is a source of high radiation. For this and other reasons, even if the required feeler gauges are prepared, much attention will have to be paid to the insertion angle of the gauges into the gaps between the fuel rods and the inserting force in order to achieve the operation with high accuracy, thus being inconvenient and troublesome.

In a future nuclear reactor, a fuel assembly having an arrangement aimed at the achievement of high degree of burnup and FIG. 35 shows a brief arrangement of such fuel assembly. The assembly 1a of FIG. 35 is shown in cross section of a lattice of eight rows and eight columns including one water rod disposed centrally in the arrangement of the fuel assembly 1a. The water rod 7a occupies a space corresponding to a space of four fuel rods 3a, hence being called a large diameter water rod 7a. This cross section is taken along the line corresponding to a portion of FIG. 34.

In a case where it is required to observe the gaps between the fuel rods 3a of the fuel assembly 1a of FIG. 35, three gaps at the central portion cannot be observed by the conventional light projection method because of the location of the large diameter water rod 7a. Moreover, when the feeler gauges are inserted into the gaps, it is difficult to precisely measure the gaps G between the fuel rods 3a and the centrally arranged large water rod 7a. The measurement of the gaps of this fuel assembly 1a by the conventional method takes much time and labor.

Recently, to eliminate the defects or drawbacks encountered in the above prior art, there has been studied and provided a method of measuring radial positions of the fuel rods and water rods by utilizing a high energy X-ray CT (cathod tube) or high engergy γ-ray CT for obtaining a tomographied image of an object. However, this method also involves a problem such that since this method utilizing the radiation is carried out in a short time because of the high radiation souce of the spent fuel assembly in addition to the usage of the radiation and the location of uranium dioxide $UO_2$ having high shielding ratio, it is not suitable for obtaining a significant S/N ratio in a short of measuring. Accordingly, in order to obtain a high precision measuring result, a long measuring time is required, thus being not practical. Moreover, in the case of the high engergy γ-ray CT, treatment or handling thereof itself involves a troublesome problem.

SUMMARY OF THE INVENTION

An object of the present invention is to substantially eliminate defects and drawbacks encountered in the prior art and to provide a method and apparatus for measuring a gap between adjoining fuel rods or between a fuel rod and a water rod arranged in a fuel assembly by utilizing a nuclear magnetic resonance, capable of measuring the gap accurately for a short time regardless of a radial sectional shape of the fuel assembly.

This and other objects can be achieved according to the present invention, in one aspect, by providing a method of measuring a gap between adjoining fuel rods or between a fuel rod and a water rod arranged in a fuel assembly in which the fuel rods and the water rod are arranged in a lattice and supported by spacers, by a gap measuring apparatus including a gap measuring device utilizing nuclear magnetic resonance, the method comprising the steps of:

preparing a container which is filled with a fluid;
setting the gap measuring device into the fluid in the container;
placing a fuel assembly to be inspected to a predetermined portion in the container;
measuring a distribution of the fluid distributed in the fuel assembly set in the container by utilizing a nuclear magnetic resonance; and
measuring the gap in accordance with the fluid distribution as an image.

In another aspect, there is provided an apparatus for measuring a gap between adjoining fuel rods or between a fuel rod and a water rod arranged in a fuel assembly in which the fuel rods and the water rod are arranged in a lattice and supported by spacers, by utilizing nuclear magnetic resonance, the apparatus comprising:

a measuring device set in a container which is filled with a fluid, the measuring device including a magnet means and coil means for generating magnetic fields, the coil means including a coil assembly for generating a gradient magnetic field and a coil assembly for generating high-frequency and detecting a nuclear magnetic resonance signal;

a controlling device for controlling the magnetic fields generated by the respective coil assemblies; and a data processor for carrying out data processing in response to a signal transmitted from the controlling device, wherein distribution of the fluid in the fuel assembly set in the container is processed as a sectional image of the fuel assembly to thereby measure the gap between adjoining fuel rods or between the fuel rod and the water rod.

In preferred embodiments in this aspect, the measuring device includes a cylindrical magnet provided with a coil in the form of solenoid for generating a static magnetic field and further including cable means including a cable for driving the magnet, a cable for driving a magnetic field adjusting coil assembly, a cable for driving the gradient magnetic field generating coil assembly and a cable for driving the high-frequency coil assembly. The gradient magnetic field generating coil assembly is disposed inside the cylindrical magnet and generates a gradient magnetic field having primary gradients in three directions crossing at right angles to each other. The coil assembly for generating the high-frequency is comprised of a saddle-shaped coil assembly for applying in shape of pulse a high-frequency with which a hydrogen atomic nucleus is magnetically resonated in the static magnetic field in a direction perpendicular to the static magnetic field and for detecting a nuclear magnetic resonance signal.

The measuring device may be composed of a magnet for generating a static magnetic field, a coil assembly disposed inside the magnet for generating gradient magnetic field and a coil assembly for generating high-frequency and receiving a nuclear magnetic resonance signal, wherein the magnet generates the static magnetic field in a direction substantially perpendicular to an axial direction of the fuel assembly set in the container, the gradient magnetic field generating coil assembly generates gradient magnetic fields in two directions crossing at right angles to each other in a plane crossing substantially at right angles to the axial direction of the fuel assembly, and the high-frequency coil assembly generates a high-frequency magnetic field in a direction substantially parallel to the axial direction of the fuel assembly. The magnet is a permanent magnet having a substantially C-shaped structure and is composed of a pair of magnet pieces disposed at opposing end faces and a ferromagnetic body connecting the magnet pieces in an integral structure and wherein hole pieces are disposed at the opposing end faces of the magnet pieces.

In both of the above aspects, the fluid is a cooling water filling the container or a gas filling the container such as CF gas.

According to the characteristics of the present invention described above, the gap between the adjoining fuel rods or between the fuel rod and the adjoining water rod of the fuel assembly is measured by utilizing nuclear magnetic resonance, and this is based on the fact that the fuel assembly is usually handled in the fluid atmosphere such as cooling water or gas. The distribution of the cooling water or gas in the fuel assembly in the fluid is measured. Thus, the gap can be exactly and safely measured.

In such gap measuring method, the gap measuring device utilizes the nuclear magnetic resonance caused by the static magnetic field generating magnet, the gradient magnetic field generating coil assembly and the high frequency coil assembly. The gap is measured as an image of the fluid filling therein.

In the preferred embodiment, the gap measuring method is performed in consideration of the omission of the generation of the dielectric coupling between the conductive loop caused by the fuel rod and the spaces of the fuel assembly and the high-frequency coil assembly. In this embodiment, more accurate measuring performance can be achieved.

DESCRIPTION OF THE PREFERRED EMBODIMENTS

A first embodiment according to the present invention will be described hereunder with reference to FIGS. 1 to 13.

Figure 1:
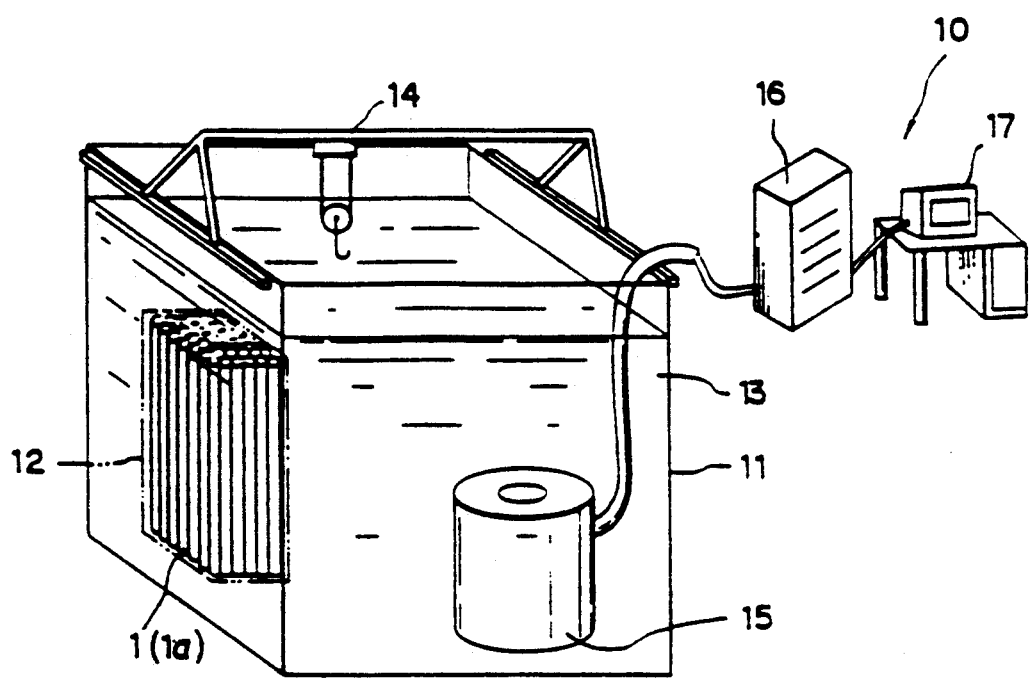
FIG. 1 is a schematic perspective view of a first embodiment of a gap measuring apparatus according to the present invention.
Figure 34:
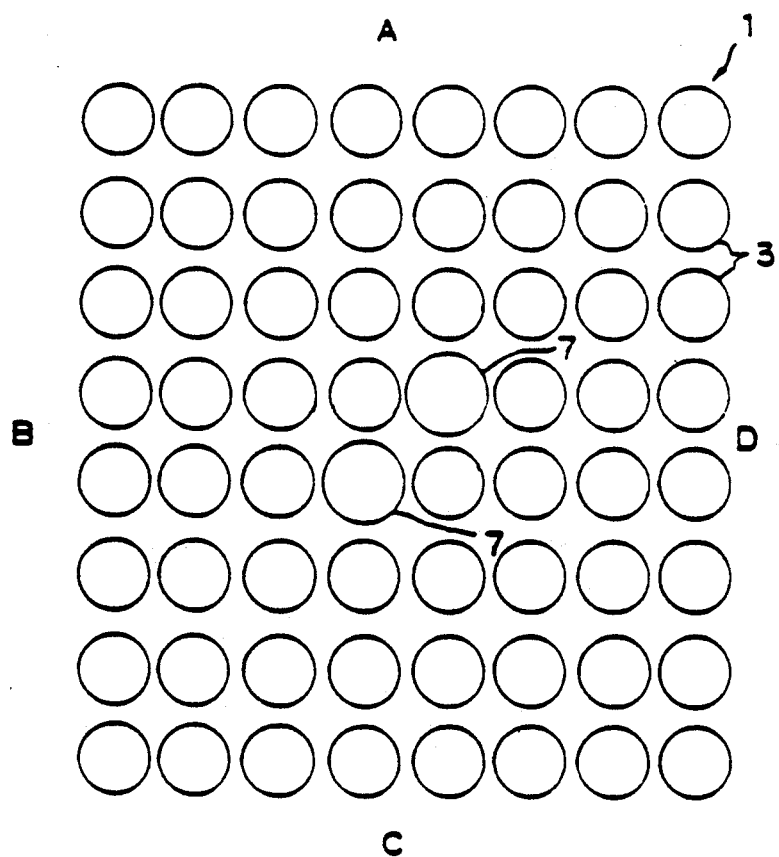
FIG. 34 is a sectional view taken along the line XXXIV—XXXIV of FIG. 33 showing one example of arrangement of fuel rods and water rods of the fuel assembly.
Figure 35:
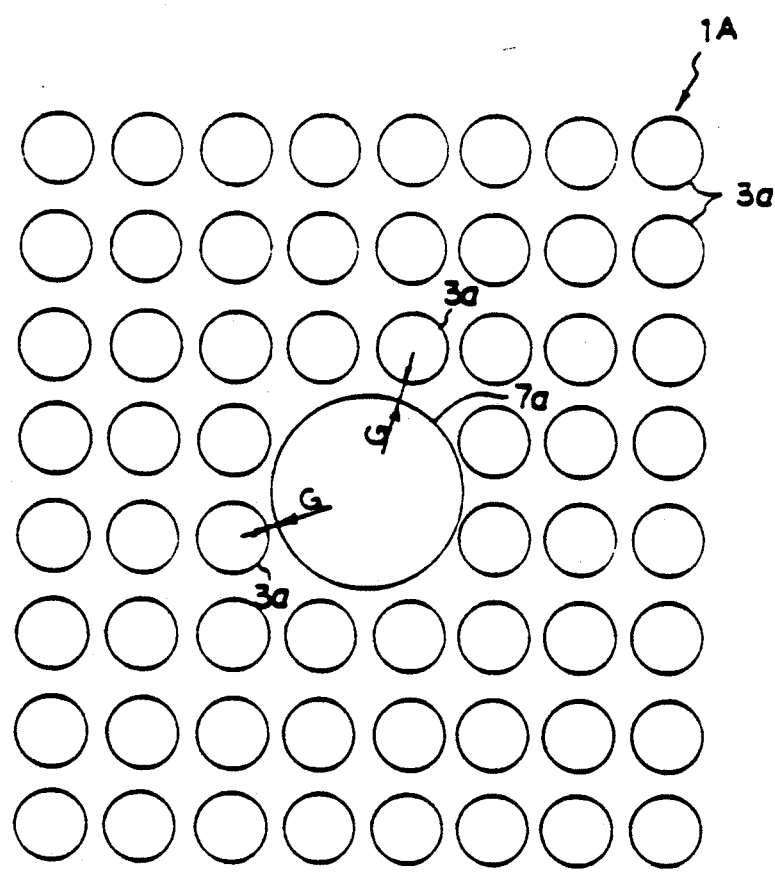
FIG. 35 is also a sectional view taken along the same line of FIG. 34, showing another arrangement.

Referring to FIG. 1, there is shown a schematic arrangement of a gap measuring apparatus for measuring a gap between adjoining fuel rods in a fuel assembly according to the present invention. The gap measuring apparatus utilizes a nuclear magnetic resonance phenomenon of a magnetic resonance imaging system 10, called hereinafter MRI system 10, for measuring gaps between fuel rods 3 or 3a and between the fuel rods and a water rod 7 or 7a as shown in FIG. 34 or 35.

The fuel assembly(-ies) 1(1a) is(are) accommodated and stored in a fuel rack 12 disposed in a fuel storage pool 11 such as a spent fuel storage pool. The fuel storage pool 11 is filled up with a cooling water 13 for countermeasure against radioactivity. The fuel assembly 1 is conveyed into the cooling water 13 by operating a crane 14 disposed, for example, above the pool 11 as shown in FIG. 1. A gap measuring apparatus of the present embodiment including a gap measuring device 15 which utilizes the nuclear resonance phenomenon of the MRI system 10 and which is disposed in the fuel storage pool 11 to be freely set therein. An inspection of the spent fuel assembly is usually performed once per year, and accordingly, the measuring device 15 is submerged in the pool 11 in this inspection period. The spent fuel assembly 1 with a channel box 2 being removed to be inspected is conveyed into the pool 11 by means of the crane 14 into a central portion, i.e. measuring area of the measuring device 15.

The MRI system 10 is provided with a control board 16 for controlling intensity of respective magnetic fields of the measuring device 15, a data processing system 17 as means for operating data in response to a nuclear magnetic resonance signal, NMR signal, measured by and inputted from the measuring device 15.

Figure 2:
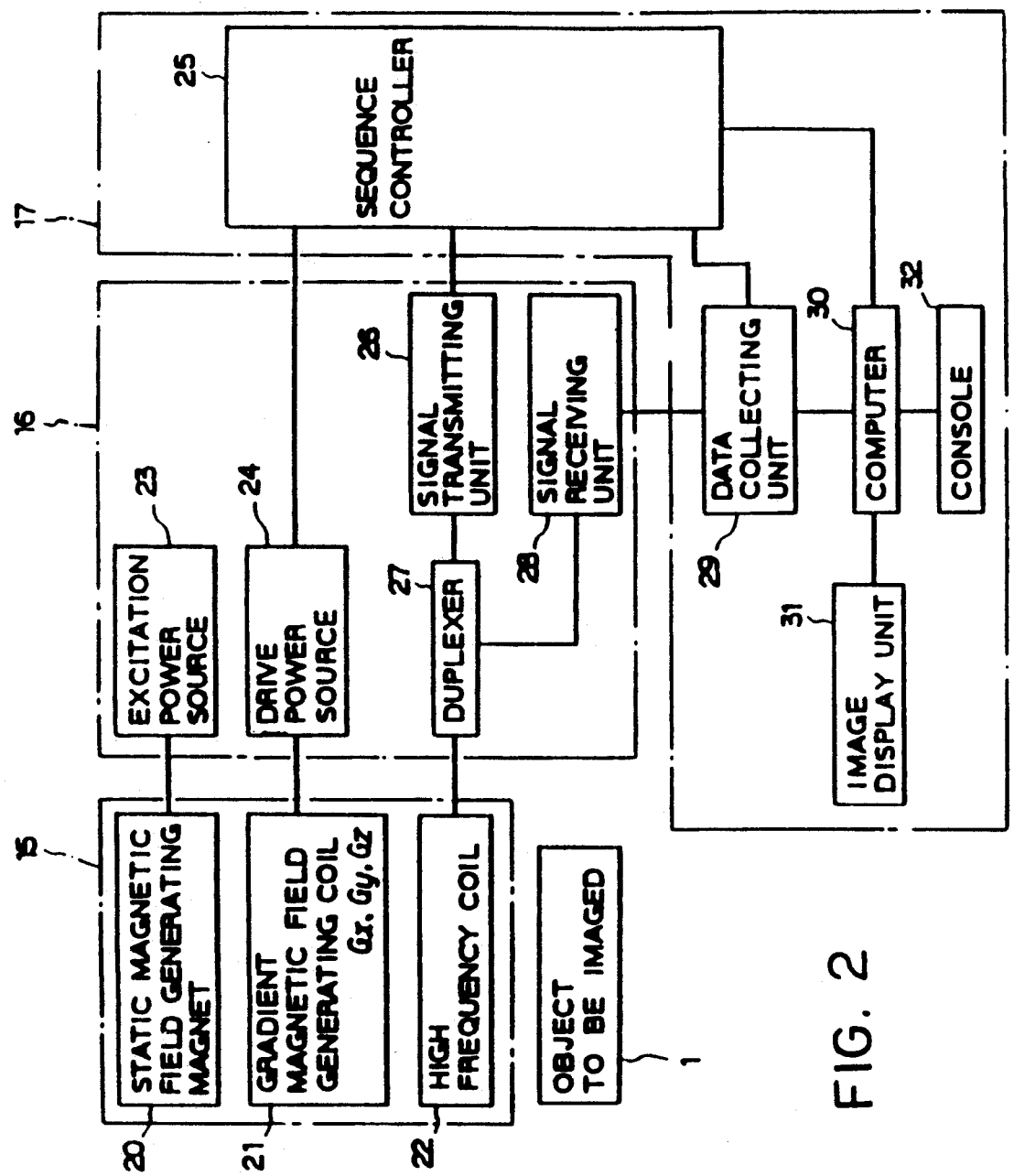
FIG. 2 is a block diagram of a nuclear magnetic resonance imaging system utilized for the present invention.

As shown in FIG. 2, the measuring apparatus 15 of the MRI system 10 is composed of a cylindrical magnet 20 for generating a static magnetic field, a gradient magnetic field generating coil assembly 21 disposed inside the magnet 20 for generating a gradient magnetic field having primary gradients in three directions perpendicular to each other, and a high-frequency, so-called RF, coil assembly 22 for irradiating a high-frequency magnetic field to the fuel assembly 1 as an object to be imaged and receiving the NMR signal from the object.

The magnet 20 is exited by a power source 23 incorporated in the control board 16. The gradient magnetic field generating coil assembly 21 comprises three coils respectively for generating a gradient magnetic field (Gx) for leading, a gradient magnetic field (Gy) for encoding and a gradient magnetic field (Gz) for slicing. These gradient magnetic fields Gx, Gy and Gz are parallel to each other in the direction of the static magnetic field and have primary gradients in three directions perpendicular to each other, and these magnetic fields are excited by electric power supplied from a gradient magnetic field driving power source 24. The power source 24 is controlled by a sequence controller 25 incorporated in the data processing system 17. The high-frequency power is supplied to the high-frequency coil assembly 22 through a duplexer unit 27 by a signal generation unit 26 controlled by the sequence controller 25.

According to the present embodiment, the measuring device 15 of the MRI system 10 is submerged into the cooling water 13 stored in the fuel storage pool 11 and set to a desired position therein. Thereafter, the channel box 2 is removed from the fuel assembly 1 and the fuel assembly with no channel box is submerged in the pool 11 by the operation of the crane 14 to a guide area 50, FIG. 6, of the measuring device 15. Namely, the fuel assembly 1 as an object to be inspected is moved and then set to an imaging area of the measuring device 15. That is, the cylindrical magnet 20 of the measuring device 15 has an inner portion suitable for accommodating at least one fuel assembly 1. Under the thus set condition, the MRI system 10 is driven to excite the magnet 20, the gradient magnetic field generating coil assembly 21 and the high-frequency coil assembly 22 of the measuring device 15. The high-frequency coil assembly 22 receives the NMR signal from the fuel assembly 1 as the object to be imaged by irradiating the high-frequency magnetic field to the fuel assembly 1 to be inspected.

The NMR signal is received, through the duplexer unit 27, by a signal receiving unit 28, in which the signal is amplified, detected and then transmitted to a data collecting unit 29 of the data processing system 17. The NMR signal inputted into the data collecting unit 29 is subjected to an A/D (analog-to-digital) conversion and fed into an electronic computer 30 in which it is processed with Fourier transformation, for example. The thus processed image is displayed to an image display unit 31, whereby an MR image having a cooling water distribution in radial cross section of the fuel assembly 1, and the gap between the adjoining fuel rods and the gap between the fuel rod and the water rod in the fuel assembly 1 can be precisely measured on the basis of the MR image thus obtained by utilizing the nuclear magnetic resonance phenomenon.

The data of the NMR signal from the high-frequency coil assembly 22 subjected to the treatment such as Fourier transformation by the computer 30 is thereafter displayed by the image display unit 31. The sequence controller 25 operates to control the drive power source 24, the signal generating unit 26 of the control board 16, the data collecting unit 29 of the data processing system 17 in response to signals from the computer 30, and the computer 30 is controlled by a console 32 provided for the data processing system 17.

Figure 3:
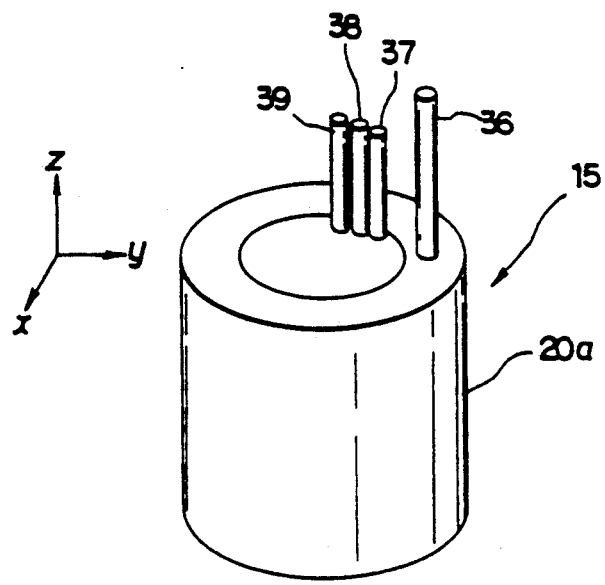
FIG. 3 is a brief perspective view of a cylindrical magnet for generating a static magnetic field constituting the gap measuring device of the first embodiment.
Figure 4:
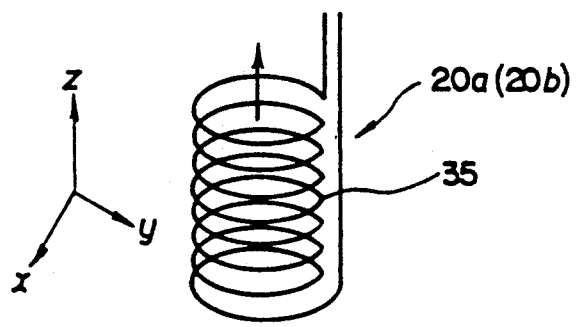
FIG. 4 is a view showing a coil assembly for generating the static magnetic field provided for the magnet of FIG. 3.

FIG. 3 shows an example of adaption of a normal (resistive)-conductive type magnet 20a for generating static magnetic field for the measuring device 15 of the MRI system 10. The magnet 20a includes a magnetic coil 35 coiled as a solenoid as shown in FIG. 4 to generate a static magnetic field in a z-direction. A cable assembly 36 for exciting the magnet 20a, a cable assembly 37 for supplying electricity to a shimming coil for adjusting the magnetic field, a cable assembly 38 for driving the gradient magnetic field generating coil, and a cable assembly 39 for transmitting or receiving signals from the high-frequency coil are electrically connected to power sources 23, 24 and 26, respectively, provided on the outside of the fuel storage pool 11. When the fuel assembly 1 is inspected, the measuring device 15 is submerged in the pool 11 and powers are supplied through the respective cable assemblies. In the normal-conductive type magnet 20, heat generated by passing large current usually constitutes a problem, but in the measuring apparatus 15 of this embodiment, the magnet for generating the static magnetic field is cooled by the cooling water in the pool 11, so that the problem of the heat generation can be solved.

Figure 5:
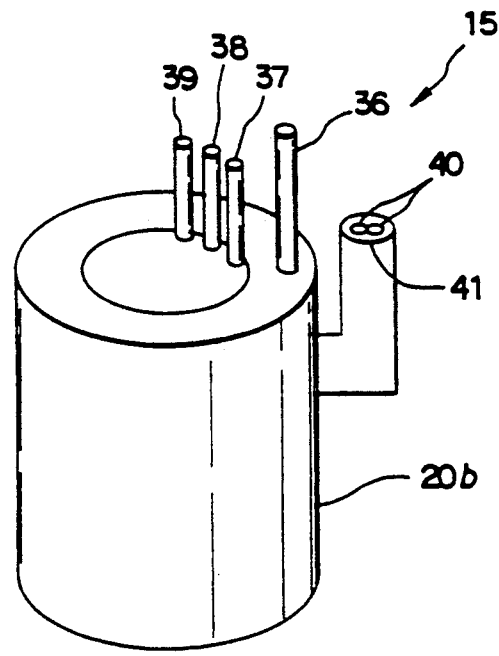
FIG. 5 is another example of the magnet shown in FIG. 3.

FIG. 5 shows a modification of the measuring device 15 of FIG. 3 and the modification utilizes a superconductive type magnet 20b for generating a static magnetic field. The magnet 20b includes a magnetic coil coiled as solenoid as shown in FIG. 4 to generate the static magnetic field in the z-direction. In this embodiment of the superconductive type magnet 20b, in addition to the four kinds of cable assemblies 36, 37, 38 and 39, a duct 40 is provided for supplying liquid helium He or liquid nitrogen $N_2$ as cooling medium and discharging evaporated He gas or $N_2$ gas. The duct 40 is covered by a heat insulation material 41 to prevent the duct 40 from being frozen by the cooling medium gas.

When it is required to utilize such super-conductive type magnet 20b, two setting methods will be considered. Namely, one is a method in which the measuring device 15 provided with this magnet 20b at the time of the inspection is disposed in the pool 11, while always making up the liquid He or $N_2$ and maintaining the superconductive state. In this method, since the static magnetic field always exists, it is difficult to set the superconductive type magnet 20b, and in addition, the continuous making-up of the liquid He or $N_2$ involves much maintenance cost, thus providing a significant problem.

The other one is a method in which the superconductive type magnet 20b is excited before the inspection and the removed is extincted after the inspection. The excitation is performed by cooling the inside of the superconductive type magnet 20b by the liquid He or liquid $N_2$, applying the cooling medium, thereafter, putting the magnet 20b into the fuel assembly storage pool 11, and then passing electric current from the power source 23 for the excitation. After the inspection, the current is made zero and the fuel assembly 1 is drawn out from the storage pool 11. The cooling medium is then recovered and the temperature of the inside of the magnet 20b is increased. In this method, it may be troublesome to cool or heat the magnet 20b before or after the inspection, but this working is easy and requires no maintenance cost because of no presence of the magnetic field at the setting time.

Figure 6:
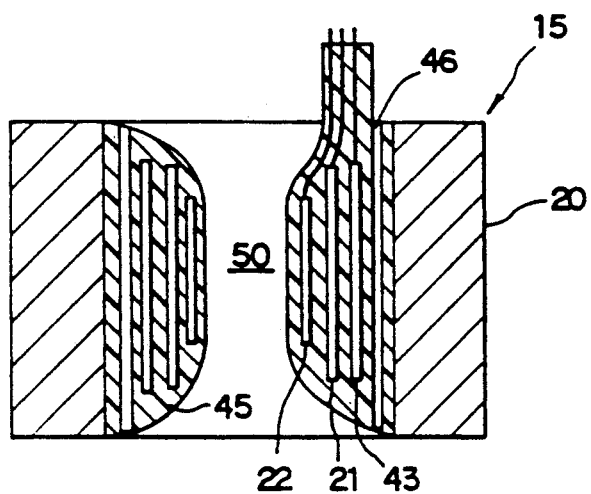
FIG. 6 is a longitudinal sectional view of the magnet including the arrangement of a shimming coil, a gradient magnetic field generating coil, a high-frequency coil.

FIG. 6 shows a sectional view showing an arrangement of the shimming coil assembly 43, the gradient magnetic field generating coil assembly 21, and the high-frequency coil assembly 22 provided inside the magnet 20 for generating the static magnetic field of the measuring device 15. These coil assemblies 43, 21 and 22 are disposed so as not to directly contact the cooling water 13 in the pool 11, and for this purpose, these coils are enveloped and secured by a resin 45, for example, having an insulating property. It is desired as the resin 45 surrounding the high-frequency coil assembly 22 to select a resin such as acrylic resin or polytetrafluoroethylene having a small dielectric dissipation factor for decreasing high-frequency loss. However, as the spent fuel assembly 1 is a high radiation source, a polyimide series resin or polyacetate series resin may be utilized as occasion demands.

The shimming coil 43 is a coil for evenly adjusting the static magnetic field and the gradient magnetic field, and usually, is composed of coil groups for generating magnetic fields respectively corresponding components ranging from zero-order to tertiary and quadrature components. In the example of FIG. 4, since the object to be imaged is the fuel assembly 1, a narrow imaging area may be adapted and it is not necessary to adjust the magnetic field to be uniform in a wide area. Furthermore, since the object to be imaged is determined, it is not so necessary to adjust the magnetic field in each inspection. Accordingly, the adjustment of the magnetic field may be performed by securing a plurality of magnetic pieces to the inner wall surface of the magnet at a time of manufacturing the magnet 20 for the measuring device 15. The number of the arrangement of the shimming coil groups may be decreased by utilizing a magnetic field adjusting method carried out by combining the shimming coil assembly 43 and the magnetic pieces. Heat is generated by passing current through the shimming coil assembly 43, but the heat will be removed by providing a gap 46 to the measuring device 15 through which cooling water flows.

The high-frequency coil assembly 22 acts so as to apply the high-frequency in the form of pulse, in which hydrogen atomic nucleus is magnetically resonated in the static magnetic field, in a direction perpendicular to the static magnetic field and to detect a generated nuclear magnetic resonance signal (NMR signal). Usually, a saddle-shaped coil assembly 46 such as shown in FIG. 7 is utilized as the high-frequency coil assembly 22.

Figure 7:
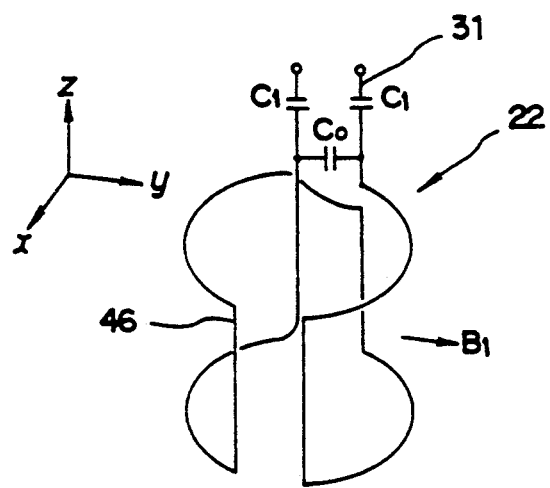
FIG. 7 is a view showing one example of the high-frequency coil.
Figure 8:
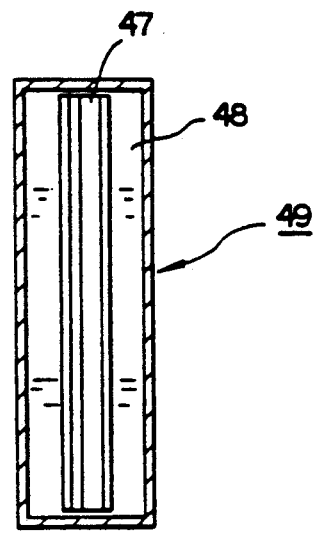
FIG. 8 is an illustration of a phantom for the explanatory of adjustment of the high-frequency coil.

The saddle-shaped coil assembly 46 of FIG. 7 has a structure suitable for the generation of a high-frequency magnetic field $B_1$ oscillating in a y-direction. The high frequency coil assembly 22 is constructed to carry out impedance matching of 50Ω, for example, for effectively performing the signal receiving and transmitting operations. In the arrangement of FIG. 7, capacitors $C_o$ and $C_1$ are provided for carrying out tuning and matching, respectively. In this embodiment, since the object to be imaged is the fuel assembly 1, it is not necessary to carry out the impedance matching every time of the inspections, and as shown in FIG. 8, the impedance will be preliminarily adjusted by utilizing a phantom 49 composed of a simulation nuclear fuel assembly 47 and a cooling water 48.

Figure 9:
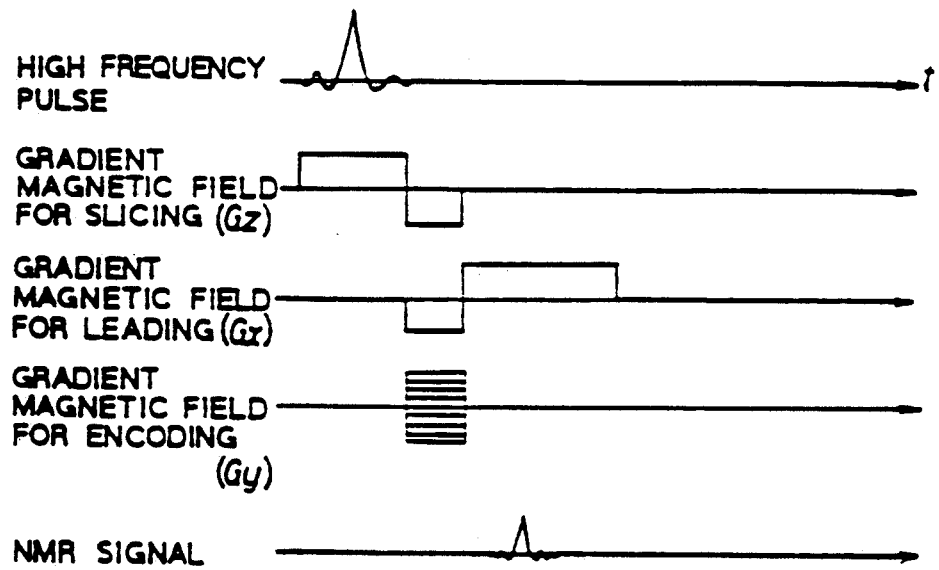
FIG. 9 shows a time chart for the explanatory of the pulse sequence for obtaining data.

FIG. 9 shows a time chart representing a pulse sequence in a case where the MR image is actually obtained by utilizing the MRI system. The measuring device 15 is first submerged into the cooling water 13 in the fuel storage pool 11, and the fuel assembly 1 with the channel box 2 being removed is then inserted into the guide portion 50 of the measuring device 15. Then, the power is applied to the high-frequency coil assembly 22 and the gradient magnetic field generating coil assembly 21 to selectively excite the hydrogen atomic nucleus, having a desired cross section, in the fuel assembly 1. In order to select the slice surface, a high-frequency pulse in which sinc function is modulated by a magnetic resonance frequency is usually applied to the high-frequency coil assembly 22, and the gradient magnetic field generating coil assembly 21 applies a gradient magnetic field Gz in the form of pulse having a gradient in an axial direction perpendicular to the slice surface. FIG. 9 shows an example in which a cross section perpendicular to the z-axis is selected by applying the gradient magnetic field Gz in the z-direction.

In the next step, the gradient magnetic fields Gx and Gy of two directions crossing at right angles in the cross section perpendicular to the selected z-axis are applied in the form of pulses, thereby generating NMR signals which are to be observed. In the example of FIG. 9, as a leading direction is utilized the x-directional gradient magnetic field Gx, and as an encoding direction is utilized the y-directional gradient magnetic field Gy. One group of sequence shown in FIG. 9 is repeated predetermined several times while changing intensity of the gradient magnetic field Gy in the encoding direction. The number of the predetermined times is usually 256 times or 128 times when an MR image of 256×256 matrix, for example, will be obtained.

Figure 10:
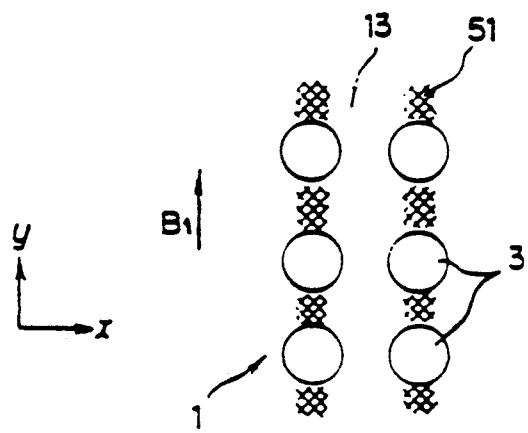
FIG. 10 is an example of an image obtained by the application of a linearly polarized field.

FIG. 10 shows an example of an MR image having a horizontal section of the fuel assembly 1 obtained in accordance with the sequence of FIG. 9. Referring to FIG. 10, the fuel rod 3 appears as silence, i.e. signal-less, area and the cooling water 13 filling the gaps between the fuel rods 3 appear as high-signal areas. The fuel rod 3 has an electric conductivity lower than copper but has a conductivity of about 1/10 of that of copper, and accordingly, the fuel rod 3 attains shielding effects against the high-frequency. Therefore, obliquely crossing line areas 51 in FIG. 10 as shades of the fuel rods 3, in a case where the direction of the high-frequency magnetic field generated by the excitation of the high-frequency coil assembly 22 is the y-direction, appear as slightly dark areas.

Figure 11:
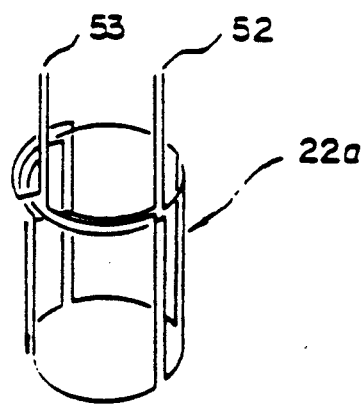
FIG. 11 is an illustration of an example of a high-frequency coil for generating a circularly polarized field.

In order to suppress such unevenness of the MR image, it will be preferred to utilize a circularly polarized field without utilizing a high-frequency field, i.e. linearly polarized field, oscillating in one direction. FIG. 11 shows one example of a high-frequency coil assembly 22a utilized for generating such circularly polarized field. The high frequency coil assembly 22a is composed of saddle-type coils 52 and 53, similar to that shown in FIG. 7, which are arranged so as to generate high-frequency magnetic fields having directions crossing at right angle to each other. A substantially circularly polarized field can be generated in the imaging area inside the coil assembly 22a by applying the same power and high-frequencies having phase difference of 90°, whereby the MR image can be suppressed.

Figure 12:
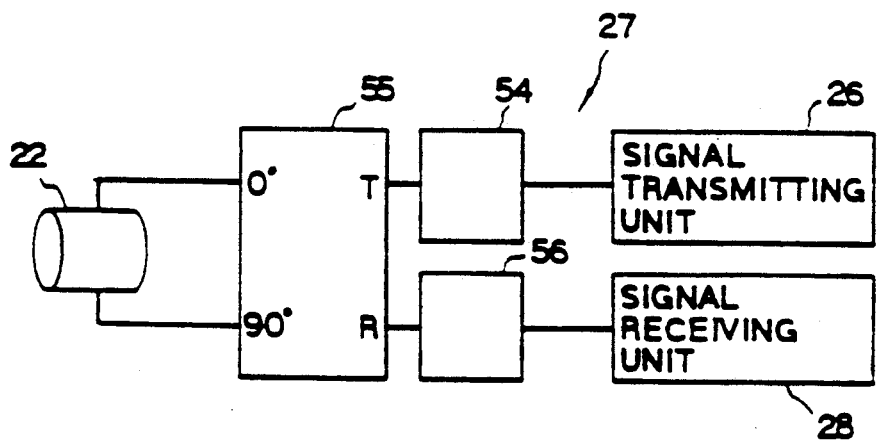
FIG. 12 is a block showing a duplexer unit connected to the high-frequency coil for generating the circularly polarized field.

FIG. 12 shows an essential construction of the duplexer unit 27 necessary for a case where the high-frequency coil assembly 22 of FIG. 11 is utilized. Referring to FIG. 12, the high-frequency pulses transmitted from the signal transmitting unit 26 are fed to a 90°-hybrid 55, through the duplexer 54, in which the pulses are divided into pulses having different phases of shifted angle of 90°. On the other hand, in the signal receiving time, the NMR signals having different phases of shifted angle of 90° are overlapped together by means of 90°-hybrid 55 and then fed to the signal receiving unit 28 through the duplexer 56.

In such operation, signals from both the coils 52 and 53 of the high-frequency coil assembly 22 are added by a voltage and noises are added by an electric power, so that the S/N ratio is increased. For example, signals obtained from the object to be imaged symmetric with respect to the directions of the respective linearly polarized fields have identical signals and noises for the respective coils 52 and 53 and these noises are not related to each other, so that the magnitudes of the NMR signals are made two times, the noises are made about 1.4 times and hence the S/N ratio is improved by about 1.4 times by adding together the phases of the NMR singals.

The operations of the duplexers 54 and 56 are made in a manner such that the duplexer 54 is made ON and the duplexer 56 is made OFF at the signal transmitting time, and on the other hand, the duplexer 54 is made OFF and the duplexer 56 is made ON at the other operation time.

Figure 13:
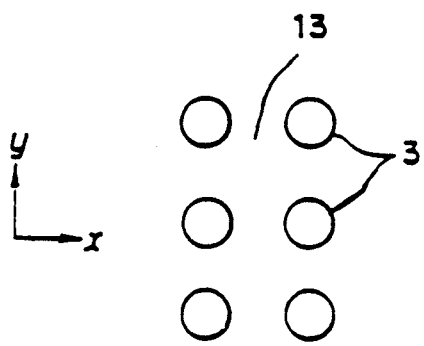
FIG. 13 is an example of an image obtained by the application of the circularly polarized field.

As described hereinbefore, an MR image having substantially even density such as shown in FIG. 13 can be obtained by generating the circularly polarized field by the high-frequency coil assembly 22. In a case where the sectional shape of the object to be imaged has a complicated shape, there is a possibility for obtaining an uneven MR image even if the circularly polarized field is utilized. In such a case, the fuel assembly 1 to be inspected is rotated so as to measure the same from the different angled positions and the thus obtained data is subjected to composite processing by the computer 30, thereby obtaining the even MR image. Otherwise, the signals are discriminated in the binary, i.e. "0, 1", discrimination at the image processing time, and signals representing portions to which signals are obtained are processed so as to have the same level. In this data processing method, the contrast of the image can be also improved.

There is also provided a modified embodiment of the first embodiment for further improving the MR imaging performance for the gap between the fuel rods in the fuel assembly as an object to be inspected.

Figure 14:
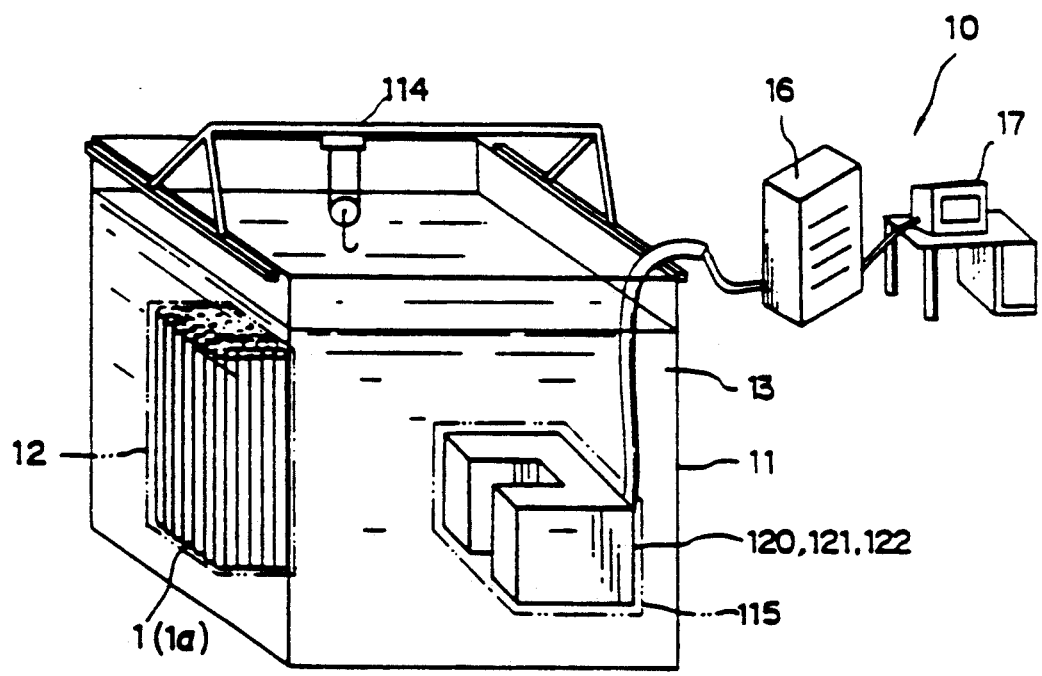
FIG. 14 is a view similar to that of FIG. 1 representing a modified embodiment of the first embodiment according to the present invention.
Figure 15:
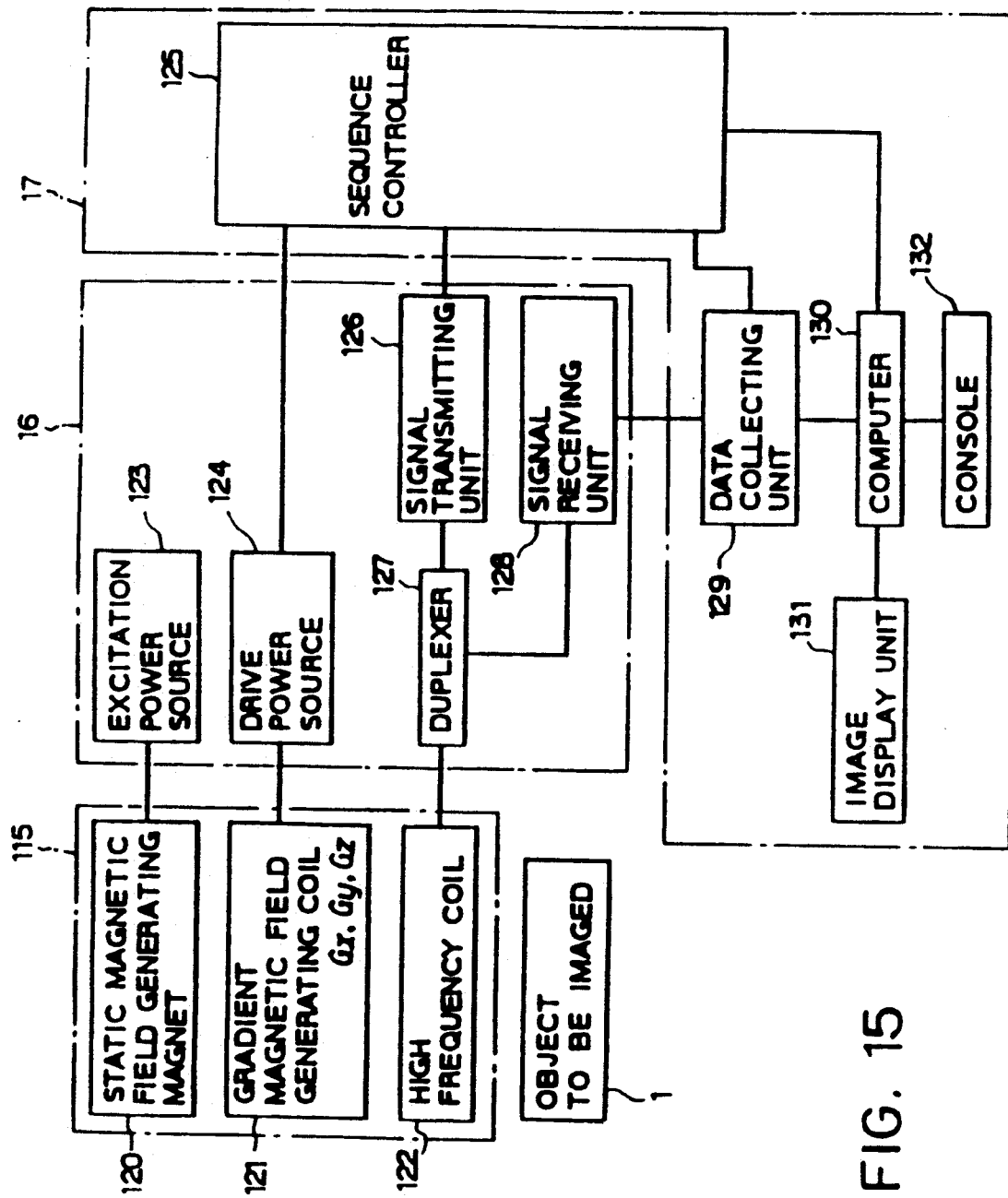
FIG. 15 is a view similar to that of FIG. 2 utilized for the modified embodiment of FIG. 14.

In this modified embodiment, as shown in FIG. 14, the measuring device 15 of FIG. 1 of the first embodiment is substituted with a measuring device 115, mainly composed of a static magnetic field generating magnet 120 shown in FIG. 15, in association with the MRI system 10, and accordingly, the same reference numerals in FIG. 14 are added to elements and members corresponding to those of FIG. 1 and their detailed descriptions are omitted herein. In this embodiment, there is also utilized the MRI system 10 of the construction substantially the same as that shown in FIG. 2, and accordingly, in FIG. 15, reference numerals are only changed by adding 100 to those of the corresponding elements or units of FIG. 2.

Figure 16:
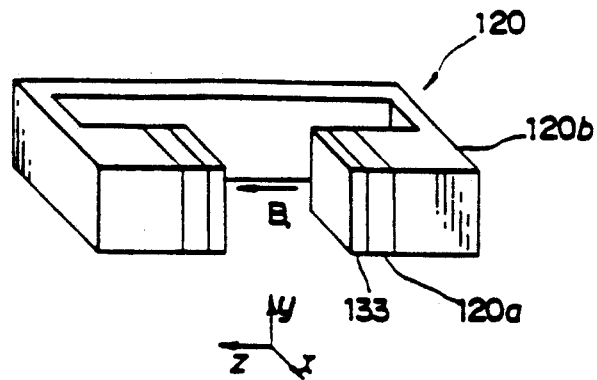
FIG. 16 is a perspective view of a C-shaped parmanent magent for generating a static magnetic field utilized for a gap measuring device of FIG. 14.

Referring to FIG. 16 showing the static magnetic field generating magnet 120 of the gap measuring device 115, the magnet 120 has a generally C-shaped outer appearance and is composed of two permanent magnets 120a and 120a disposed at opposing ends which are connected through a ferromagnetic body 120b to thereby form a magnetic circuit. The permanent magnets 120a are formed by a material such as ferrite, Sm-Co alloy or rare earth element alloy such as Nb-Fe-B alloy. Hole pieces 133, formed by iron element, for example, are disposed to the opposing faces of the permanent magnets 120a for improving the evenness of the magnetic field.

An area defined by the opposing faces of the permanent magnets 120a and 120a of the static magnetic field generating magnet 120 is formed as an imaging area, in which the z-directional magnetic field is generated. The fuel assembly 1 (1a) to be imaged is to be inserted into the pool 11 along the y-direction in the perpendicular attitude. That is, the distance between the permanent magnets 120a and 120a is suitable for the location of the fuel assembly 1 to be inspected, since the intensity of the magnetic fields generated by the permanent magnets 120a is changed in response to the change of temperature, it is necessary to carry out temperature control. However, in the present embodiment, as the permanent magnets 120a are used in a condition submerged in the cooling water 13 in the pool 11, it has a structure as a constant temperature bath, and hence, specific temperature control is not required. Becase of less leakage magnetic field of the permanent magnets 120a, the conveying-in and -out working of the magnets evey inspection time can be easily performed.

Figure 17:
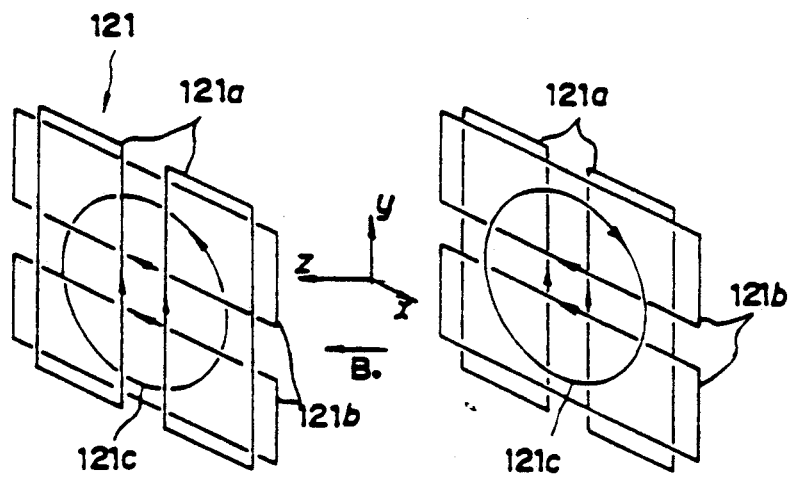
FIG. 17 is a view showing an arrangement of a coil assembly for generating a gradient magnetic field.

FIG. 17 shows one example of a gradient magnetic field generating coil assembly 121 usable at the time of using the permanent magnets 120a of FIG. 16, which is called an Anderson-type coil. In FIG. 17, the coil assembly 121 comprises a pair of coil arrangement each composed of three gradient magnetic field generating coils 121a, 121b and 121c generating x-, y- and z-directional magnetic fields, respectively. These coils 121a, 121b and 121c are arranged in one plane and a pair of these coil arrangements are disposed on the opposing face sides of the respective permanent magnets 120a and 120a. The gradient magnetic field generating coil assembly 121 generates a gradient magnetic field which is parallel to the static magnetic field direction, i.e. z-direction, and primary gradients in three directions crossing at right angle to each other.

Figure 18:
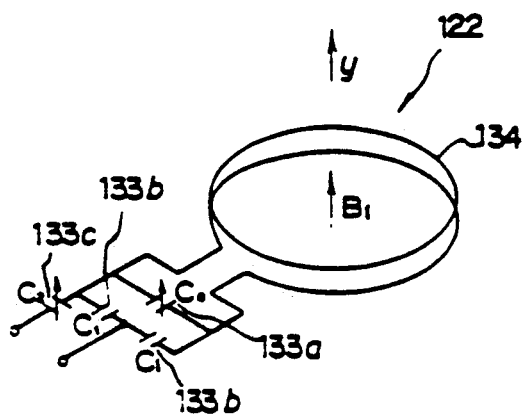
FIG. 18 is a view showing a solenoid-type coil assembly for generating a high-frequency.

FIG. 18 shows a structure of a solenoid-type high-frequency coil assembly 122. This high-frequency coil assembly 122 is set to generate a high-frequency magnetic field directed towards the y-direction, and the fuel assembly 1 is inserted into the coil assembly 121 along the y-direction. The high-frequency coil assembly 122 comprises a coil 134 and a circuit portion including tuning and matching capacitors 133a, 133b and 133c for effectively carrying out signal transmitting and receiving operations and, for example, for carrying out an impedance matching of 50 Ω.

Figure 19:
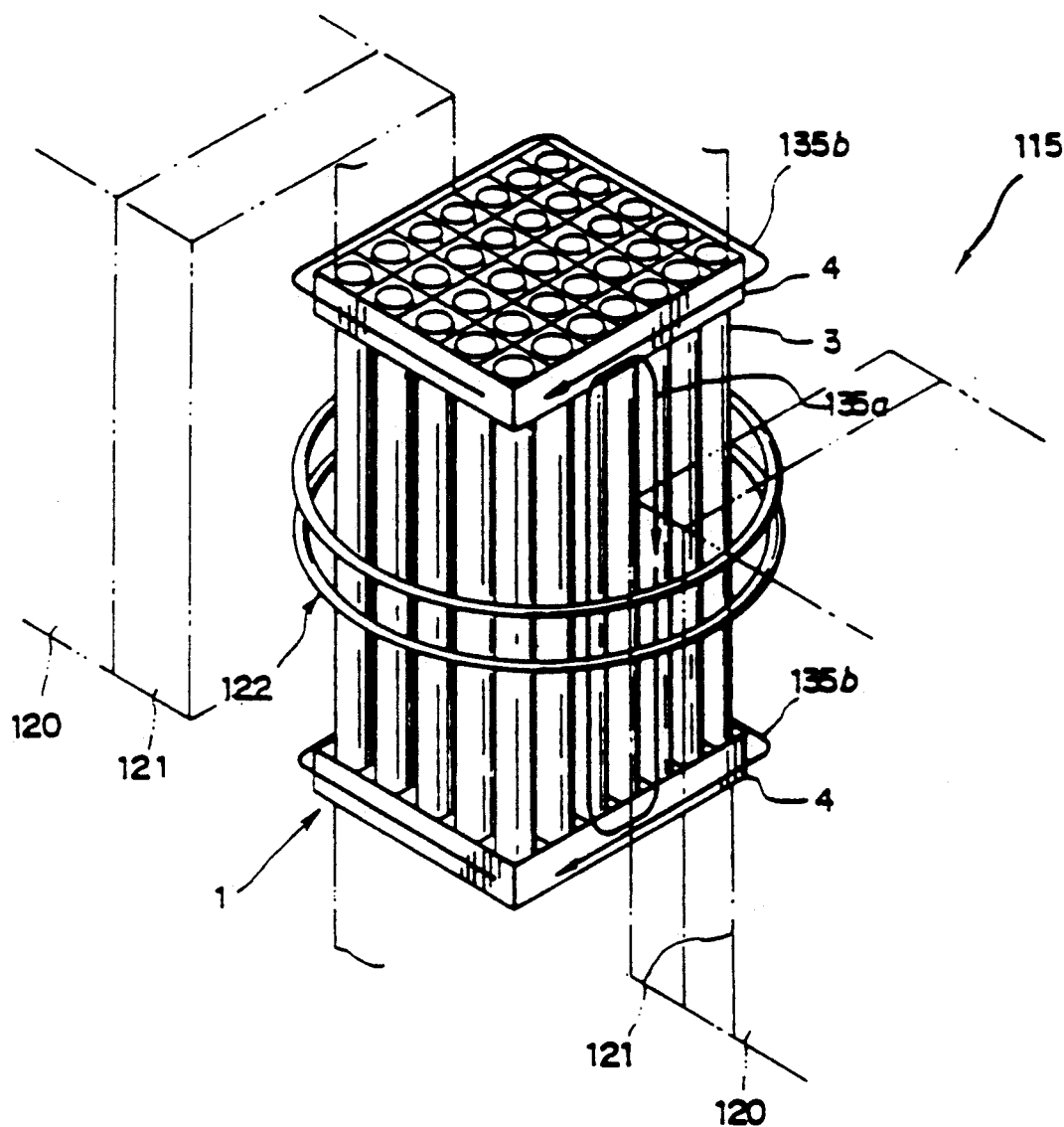
FIG. 19 is a perspective view of a part of the fuel assembly disposed in the gap measuring device.

FIG. 19 represents a condition in which the fuel assembly 1 as an object to be imaged is inserted into the measuring device 115. A conductive loop formed by the fuel rods 3 and the spacers 4 includes a first conductive loop 135a parallel to a plane including an axis of the solenoid-type high frequency coil assembly 122 and a second conductive loop 135b formed in the spacer 4 itself. With respect to the first conductive loop 135a, mutual dielectric coupling can be prevented by arranging the high-frequency coil assembly 122 to an intermediate portion between the adjoining two spacers 4 of the fuel assembly 1. The second conductive loop 135b couples with the high-frequency coil assembly 122 and slightly reduces the intensity of the high-frequency magnetic field in the imaging area, but it is possible to make image the water existing in the gap between the fuel rods 3. In this embodiment, the imaging area means an area to which some extent of the high-frequency magnetic field generated by the high-frequency coil assembly 122 reaches, that is, a cylindrical area including an axial central plane and having a width substantially identical to the axial diameter of the coil assembly. The shorter the axial length of the coil assembly 122 with respect to the distance between the adjoining spacers, the lesser is the coupling degree, and the S/N ratio is improved with small high-frequency power and the imaging of the water in the gap can be made possible.

Figure 20:
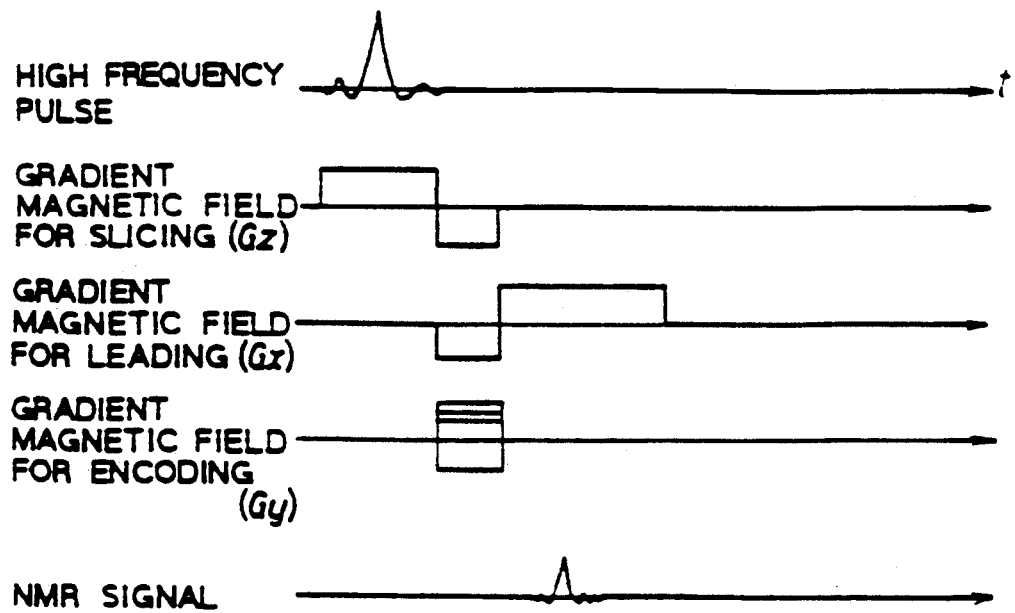
FIG. 20 is a time chart similar to that of FIG. 9 for the modified embodiment.

FIG. 20 shows a time chart representing a pulse sequence in a case where the MR image is actually obtained by utilizing the MRI system. The measuring device 115 is first submerged into the cooling water 13 in the fuel storage pool 11, and the fuel assembly 1 with the channel box being removed is then inserted into the guide portion of the measuring device 115. Then, there is applied the high frequency pulse and the gradient magnetic field to selectively excite the hydrogen atomic nucleus, having a desired cross section, in the fuel assembly 1. In order to select the slice surface, a high-frequency pulse in which sinc function is modulated by a magnetic resonance frequency is usually applied and the gradient magnetic field is applied having the axial gradient perpendicular to the slice surface is applied in the form of the pulse.

In the next step, the gradient magnetic fields of two directions crossing at right angles in the selected sectional surface are applied in the form of pulses, thereby generating NMR signals which are to be observed. In the example of FIG. 20, as a leading direction is utilized the x-directional gradient magnetic field Gx, and as an encoding direction is utilized the y-directional gradient magnetic field Gy. One group of sequence shown in FIG. 20 is repeated predetermined several times while changing intensity of the gradient magnetic field Gy in the encoding direction. The number of the predetermined times is usually 256 times or 128 times when an MR image of 256×256 matrix, for example, will be obtained. Further, the gradient magnetic field Gy in the slice direction because the fuel rods and the like are not uniform in the y-direction in the imaging area.

In this embodiment, since a relatively narrow imaging area can be utilized, it is not necessary to adjust the uniformity of the magnetic field in a wide range, and since an object to be imaged is predetermined, the magnetic field adjustment is also not significantly required every time of the inspection, but if it is required to do so, a magnetic field adjusting coil means may be provided.

Figure 22:
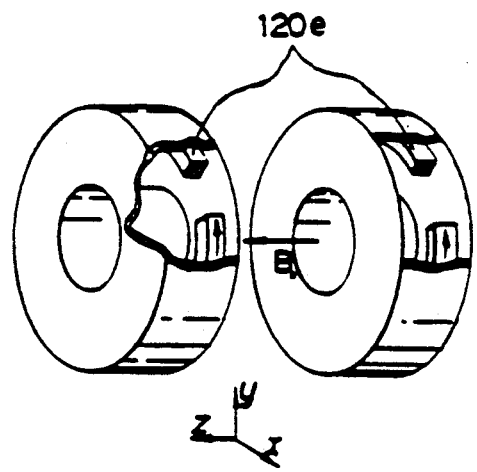
FIG. 22 is a perspective view of a Helmhltz-type magent showing another example of the magnet.

The magnetic field adjusting coil assembly is usually composed of coil groups for respectively generating magnetic field corresponding to the respective components of zero-order to tertiary or quadrature component of the spherical harmonic function. The magnetic field adjusting coil assembly may be arranged in a plane like the gradient magnetic field generating coil assembly 121 shown in FIG. 17 or coil assembly 121 of cylindrical structure such as shown in FIG. 22, referred to hereinlater.

It will be preferred to fixedly seal the gradient magnetic field generating coil assembly 121, the high-frequency generating coil assembly 122 and the magnetic field adjusting coil assembly by a resin material, for example, having an insulating property for preventing these coil assemblies from directly contacting the cooling water in the pool 11, and particularly, it will be preferred to cover the high-frequency generating coil assembly 122 by a resin material such as acrylic resin or polytetrafluoroethylene having small dielectric dissipation factor for minimally reducing the high-frequency loss.

According to this modified embodiment, since the high-frequency magnetic field is generated in a direction substantially parallel to the axial direction of the fuel assembly 1, the dielectric coupling phenomenon can be significantly reduced with respect to the conductive loop 135a in a plane parallel to the axial direction of the fuel assembly 1, and accordingly, the high-frequency magnetic field can be surely generated inside the fuel assembly 1, thereby obtaining the tomographed image with high accuracy and precisely observing the gap between the adjoining fuel rods and between the fuel rod and the water rod.

Furthermore, the magnet 120 for generating the static magnetic field is composed of a permanent magnet, so that the magnetic field leaks less and the measuring device conveying working every inspection time can be made easy.

Moreover, since the high-frequency coil assembly 122 utilizes a solenoid-type coil element and is arranged around the axis of the fuel assembly 1, the degree of dielectric coupling can be significantly reduced by making shorter the axial length of the coil assembly 122 than the gaps between the adjoining spacers of the fuel assembly, thereby enabling the cooling water between the fuel rods to be imaged with improved S/N ratio with less high-frequency power.

Further modified embodiments will be described hereunder.

Figure 21:
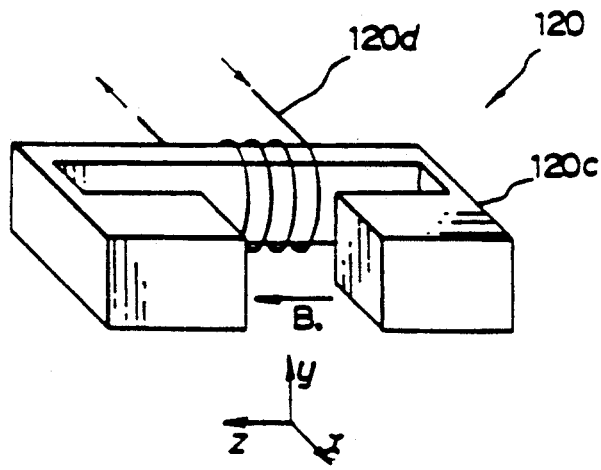
FIG. 21 is a view similar to that of FIG. 16 showing another example of the magnet.

In the described embodiment, the magnet 120 for generating static magnetic field is composed of a permanent magnet, but an electromagnet may be utilized. FIG. 21 shows an example utilizing the electromagnet, in which an iron-core type magnet is utilized. In FIG. 21, a magnetic circuit is formed by passing current by winding up a coil 120d around a ferromagnetic body 120c to thereby generate a magnetic field in the z-direction in the gap between the fuel rods 3.

Referring to FIG. 22, the magnet 120 for generating the static magnetic field utilizes a Helmholtz type coldconductive type coil element. In this example, currents pass in the same direction of two coils 120e and the z-directional magnetic field is generated in the area between the two loops 120e. Four or more loops may be utilized for further improving the evenness of the static magnetic fields.

In the examples of FIGS. 21 and 22 which utilize the cold conductive type magnet, heat generation caused by passing large current provides a problem, but according to the present invention, the outer surface of the magnet can be cooled by the cooling water, so that the measuring device 115 can be used by submerging the magnet into the pool and passing the current at the time of only the inspection.

Figure 23:
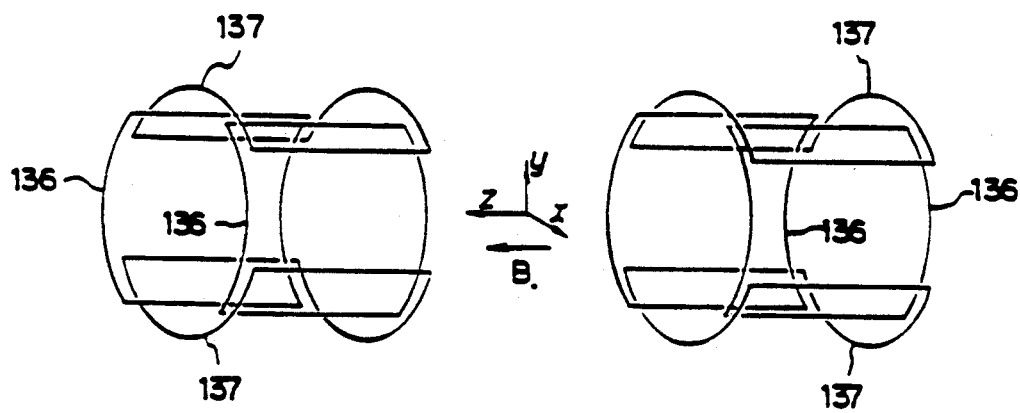
FIG. 23 is a view showing another example of the coil for generating the gradient magnetic field.

FIG. 23 shows an arrangement of an x-directional gradient magnetic field generating coil 136 and a y-directional gradient magnetic field generating coil 137 applied to the Helmholtz type magnet shown in FIG.

22. A pair of cylindrical coils 136 and 137 are arranged inside the two loops of the Helmholtz type magnet.

Figure 24:
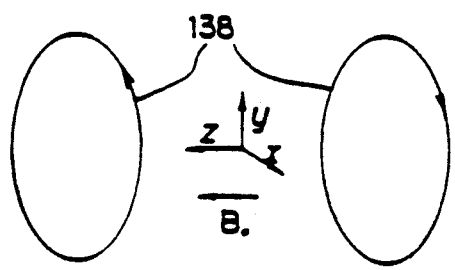
FIG. 24 is a view of a further example of the coil for generating the gradinet magnetic field.

FIG. 24 shows an arrangement of a z-directional gradient magnetic field generating coil 138 applied to the Helmholtz type magnet shown in FIG. 22, and the coil 138 may be arranged inside the two loops of the Helmholtz type magnet.

In the first embodiment described above, the measuring device does not include a driving means and a plurality of secondary images in the z-direction can be obtained only by the electrical operation. In addition, only the coil assemblies are disposed near the fuel assembly, so that countermeasure against the radiation can be improved, and for example, in the measurement of the spent fuel assembly having surface dose of $1 \times 10^6$ R/h, the reliability and durability are also remarkably improved.

Figure 25:
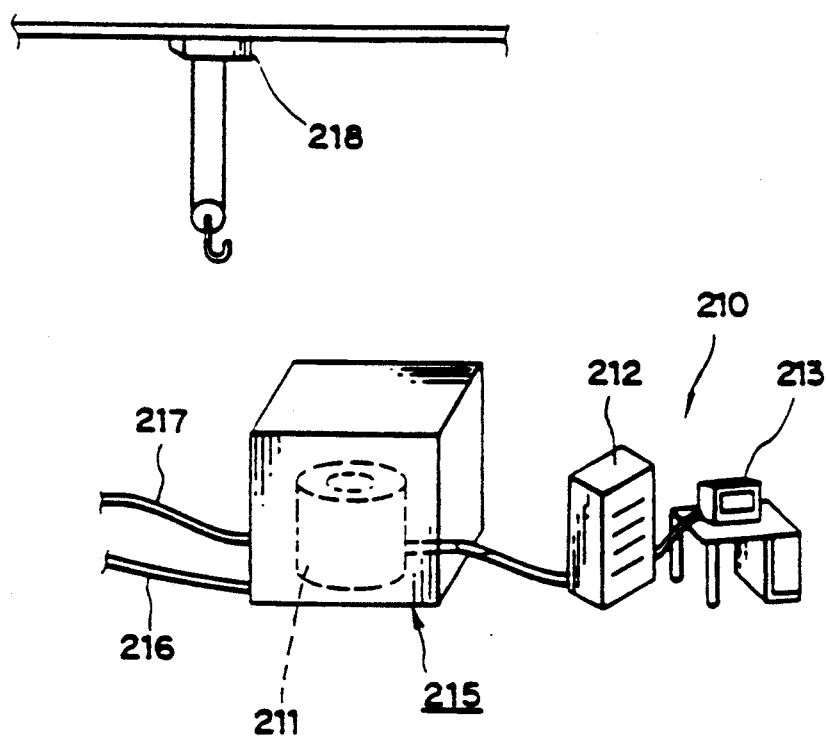
FIG. 25 is a schematic perspective view of a second embodiment of a gap measuring apparatus according to the present invention.

FIGS. 25 shows a second embodiment according to the present invention, in which a measuring device for measuring gap between adjoining fuel rods in a fuel assembly to be inspected is disposed in an atmospherere filled with a specific gas.

The main difference of this embodiment from the first embodiment resides in the fact that, in the first embodiment and its modified embodiments, the gap measuring device is disposed in the cooling water, and in the present second embodiment, the apparatus is disposed in an atmosphere filled with gas, called gas atmosphere hereunder. Hence, in the following disclosure is substantially identical to that of the first embodiment by replacing the cooling water pool 11 with a gas filled container 215 filled with a specific gas such as $CF_4$.

Figure 33:
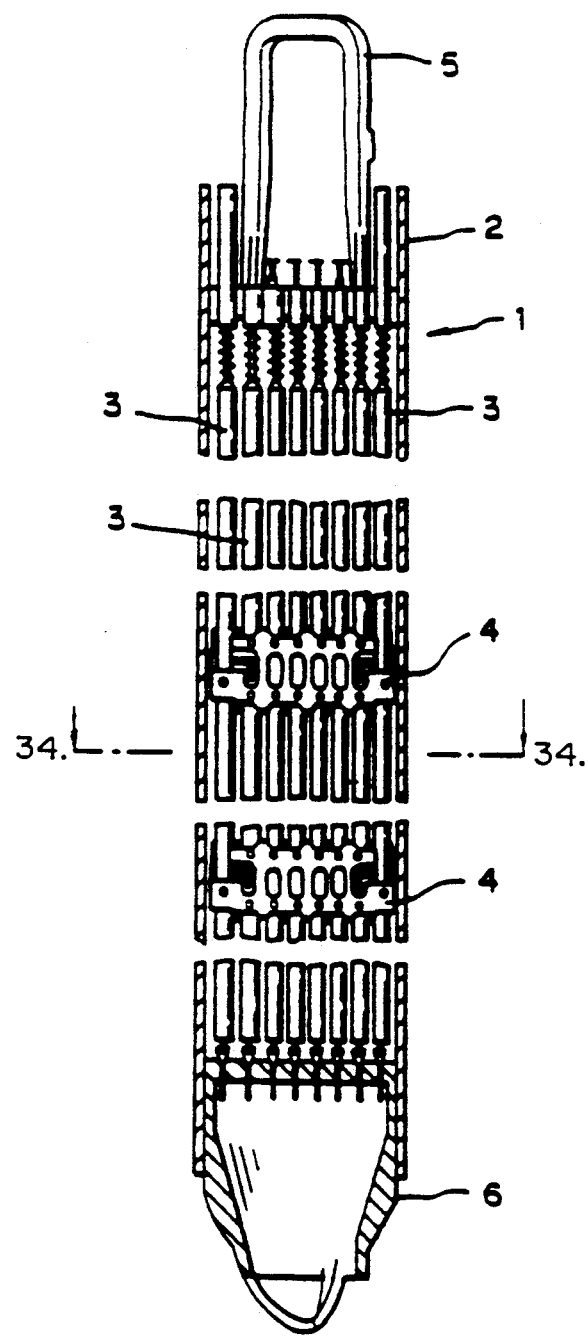
FIG. 33 is an elevational section of a usual fuel assembly which is subjected to the gap measuring method according to the present invention.

Referring to FIG. 25, the gap measuring device 211 utilizes a nuclear magnetic resonance phenomenon of a magnetic resonance imaging system 210, called MRI system hereunder, for measuring gaps between the adjoining fuel rods and between the fuel rod 3 (3a) and the water rod 7 (7a) in the fuel assembly 1 (1a) shown in FIGS. 33 to 35.

The MRI system 210 is constructed in combination by a gap measuring device 211, a control board 212 for controlling intensity of respective magnetic fields of the gap measuring apparatus 211, a data processing system 213 as means for processing data in response to a nuclear magnetic resonance signal, NMR signal, measured by and inputted from the gap measuring device 211.

The gap measuring device 211 is accommodated in a gas filled chamber of a container 215. As shown in FIG. 25, the gas filled chamber, of the container 215 is communicated with a gas supply source, not shown, through a gas supply pipe 216 and air in the chamber is discharged outward through an air discharge pipe 217. After the discharging of the air, a specific gas such as CF. gas is supplied into the chamber through the gas supply pipe 216 to set the inner gas pressure of the chamber slightly higher than atmospheric pressure. As the specific gas, an isotope of an inactive gas having a nuclear spin such as $^3$He, $^{129}$Xe or $^{131}$Xe may be utilized instead of $CF_4$ gas.

After the gap measuring device 211 is adjusted in the manner described, the fuel assembly 1 to be inspected is conveyed into the gas filled chamber with the channel box 2 being removed by means of a crane 218 and set to the measuring area at substantially the central portion of the container 215.

Figure 26:
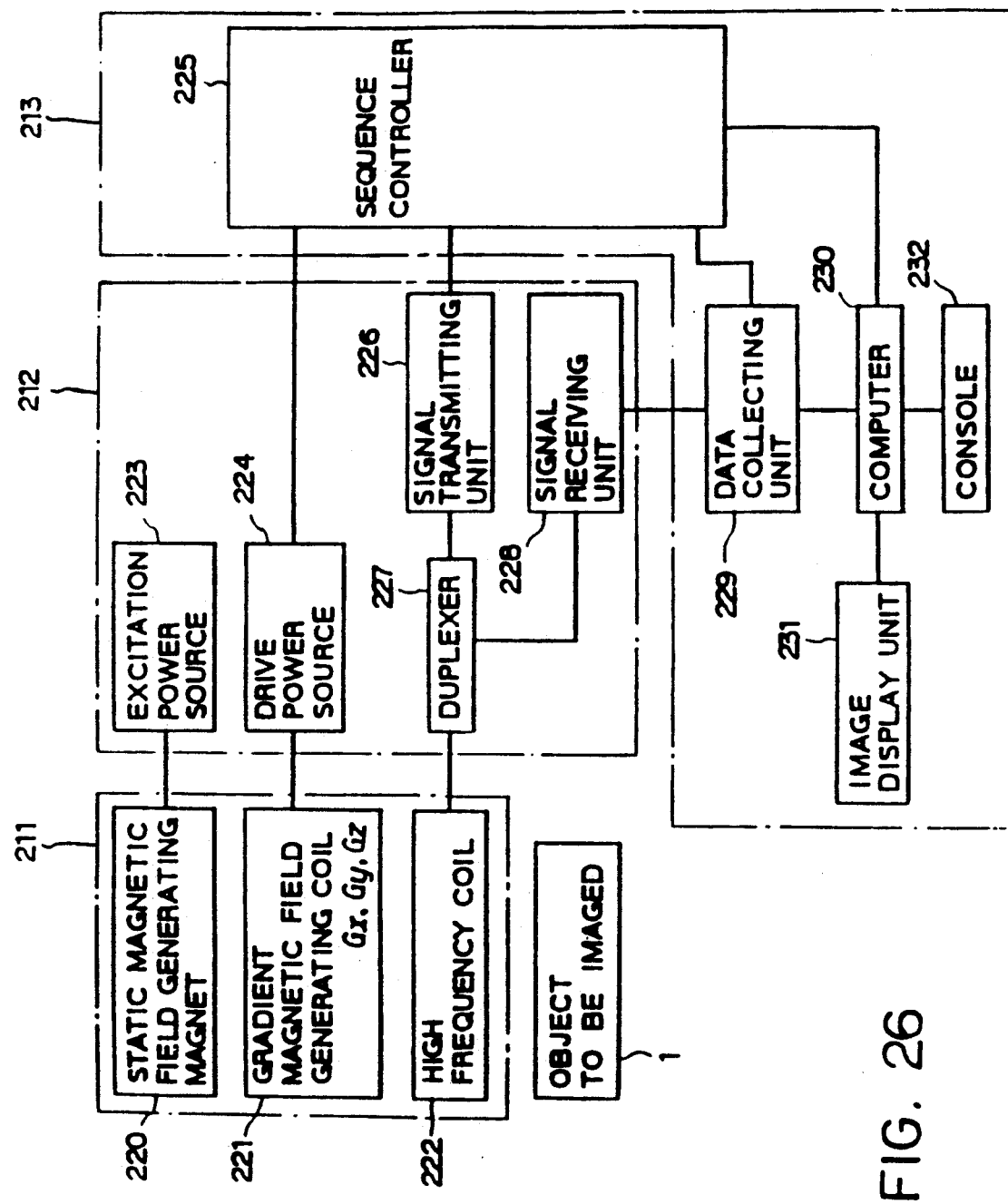
FIG. 26 is a block diagram similar to that of FIG. 2 for the second embodiment for the present invention.

The MRI system 210 is composed of substantially the same elements or units as those of the first embodiment shown in FIG. 2, and as shown in FIG. 26, the measuring device 211 is composed of a cylindrical magnet 220 for generating a static magnetic field, a gradient magnetic field generating coil assembly 221 disposed inside the magnetostatic magnet 220 for generating a gradient magnetic field having a primary gradient in three directions perpendicular to each other, and a high-frequency coil assembly 222 for irradiating a high-frequency magnetic field to the fuel assembly 1 as an object to be imaged and receiving the NMR signal from the object.

The magnet 220 is excited by a power source 223 for excitation incorporated in the control board 212. The gradient magnetic field generating coil assembly 221 comprises three coil elements respectively for generating a gradient magnetic field (Gx) for leading, a gradient magnetic field (Gy) for encording and a gradient magnetic field (Gz) for slicing. These gradient magnetic fields Gx, Gy and Gz are parallel to each other in the direction of the static magnetic field and have primary gradients in three directions perpendicular to each other, and these magnetic fields are excited by electric power supplied from a gradient magnetic field driving power source 224. The power source 224 is controlled by a sequence controller 225 incorporated in the data processing system 213. The high-frequency power is supplied to the high-frequency coil assembly 222 through a duplexer unit 227 by a signal generation unit 226 controlled by the sequence controller 225.

According to the present embodiment, the measuring device 211 is set in a gas filled chamber of the container 215 filled with a specific gas such as $CF_4$. Thereafter, the channel box is removed from the fuel assembly 1 and the fuel assembly with no channel box is moved in the gas filled chamber of the container 215 by the operation of the crane 218 to a guide area of the measuring device 211. Namely, the fuel assembly 1 as an object to be inspected is moved and then set to an imaging area of the measuring device 211. Under the thus set condition, the MRI system is driven to excite the magnet 220, the gradient magnetic field generating coil assembly 221 and the high-frequency coil assembly 222 of the measuring device 211. The high-frequency coil assembly 222 receives the NMR signal form the fuel assembly 1 as the object to be imaged by irradiating the high-frequency magnetic field to the fuel assembly 1 to be inspected.

The NMR signal is received, through the duplexer unit 227, by a signal receiving unit 228, in which the signal is amplified, detected and then transmitted to a data collecting unit 229 of the data processing system 213. The NMR signal inputted into the data collecting unit 229 is subjected to an A/D conversion and fed into an electronic computer 230 in which it is processed with Fourier transformation, for example. The thus processed image is displayed to an image display unit 231, whereby an MR image having a specific gas, such as $CF_4$, distribution in radial cross section of the fuel assembly 1, and the gap between the adjoining fuel rods and the gap between the fuel rod and the water rod in the fuel assembly 1 can be precisely measured by the MR image thus obtained by utilizing the nuclear magnetic resonance phenomenon.

The data of the NMR signal from the high-frequency coil assembly 222 subjected to the treatment such as Fourier transformation by the computer 230 is thereafter displayed by the image display unit 231. The sequence controller 225 operates to control the drive power source 224, the signal generating unit 226 of the control board 212, the data collecting unit 229 of the data processing system 213 in response to signals from the computer 230, and the computer 230 is controlled by a console 232 provided for the data processing system 213.

Figure 27:
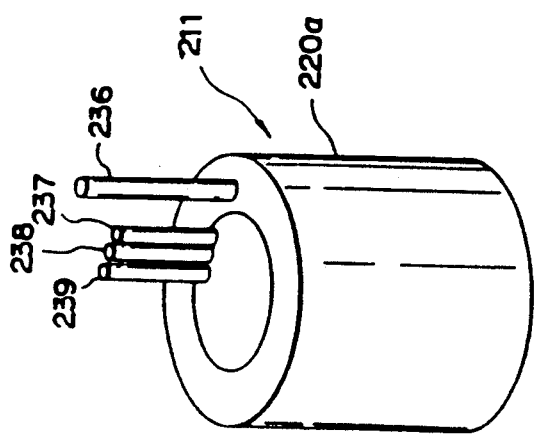
FIG. 27 is a brief perspective view similar to that of FIG. 3 according to the second embodiment.

FIG. 27 shows an example of adaption of a normal (resistive)-conductive type magnet 220a for generating static magnetic field for the measuring device 211. The magnet 220a includes a magnetic coil 236 coiled as a solenoid, such as shown in FIG. 4, to generate a static exciting the magnet 220a, a cable assembly 236 for exciting the magnet 220a, a cable assembly 237 for supplying electricity to a shimming coil for adjusting the magnetic field, a cable assembly 238 for driving the gradient magnetic field generating coil assembly, and a cable assembly 239 for transmitting or receiving signals from the high-frequency coil assembly are electrically connected to power sources 223, 224 and 226, respectively, provided on the outside of the gas filled container 215. When the fuel assembly 1 is inspected, the measuring device 211 is disposed in the gas filled chamber of the container 215 and power is supplied through the respective cable assemblies.

Figure 28:
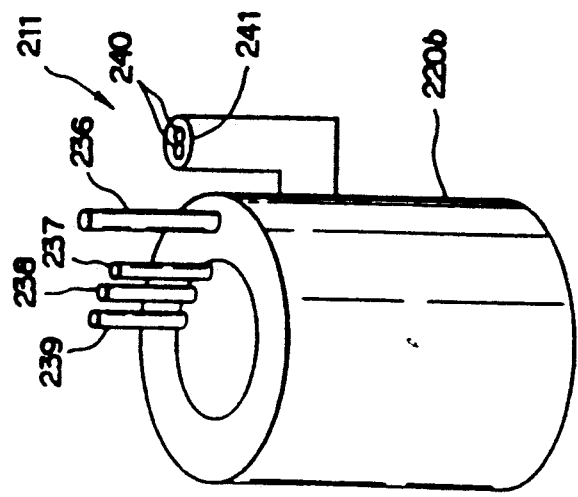
FIG. 28 is another example of the magnet shown in FIG. 27.

FIG. 28 shows a modification of the measuring devices utilized for the MRI system 210 of FIG. 27 and the modification utilizes a superconductive type magnet 220b for generating a static magnetic field. The magnet 220b includes a magnetic coil coiled as solenoid to generate the static magnetic field in the z-direction. In this embodiment of the superconductive type magnet 220b, in addition to the four kinds of cable assemblies 236, 237, 238 and 239, a duct 240 is provided for supplying liquid helium He or liquid nitrogen $N_2$ as cooling medium and discharging evaporated He gas or $N_2$ gas. The duct 240 is covered by a heat insulating material 241 to prevent the duct 240 from being frozen by the cooling medium gas.

When it is required to utilize such superconductive type magnet 220b, two setting methods will be considered. Namely, one is a method in which the measuring device 211 provided with this magnet 220b at the time of the inspection is set in the container 215 filled with the specific gas such as $CF_4$, while always making up the liquid He or $N_2$ and maintaining the superconductive state. In this method, since the static magnetic field always exists, it is difficult to set the superconductive type magnet 220b, and in addition, the continuous making-up of the liquid He or $N_2$ involves much maintenance cost, thus providing a significant problem.

The other one is a method in which the superconductive type magnet 220b is excited before the inspection and the removed is extincted after the inspection. The excitation is performed by cooling the inside of the superconductive type magnet 220b by the liquid He or liquid $N_2$, applying the cooling medium, thereafter, putting the magnet 220b into the gas filled container 215, and then passing electric current from the power source 223 for the excitation. After the inspection, the current is made zero and the fuel assembly 1 is taken out from the container 215. The cooling medium is then recovered and the temperature of the inside of the magnet 220b is increased. In this method, it may be troublesome to cool or heat the magnet 220b before or after the inspection, but this working is easy and requires no maintenance cost because of no presence of the magnetic field at the setting time.

The arrangement of the shimming coil assembly in this second embodiment is substantially identical to that shown in FIG. 6 and described with reference to the first embodiment, and the description of the shimming coil assembly in this embodiment is now omitted.

Figure 29:
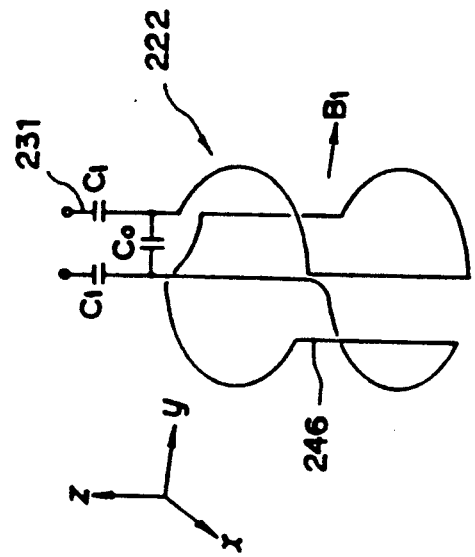
FIG. 29 is a view showing one example of the high-frequency coil similar to that of FIG. 7.

The high-frequency coil assembly 222 acts so as to apply the high-frequency in the form of pulse, in which hydrogen atomic nucleus is magnetically resonated in the static magnetic field, in a direction perpendicular to the static magnetic field and to detect a generated nuclear magnetic resonance signal (NMR signal). Usually, a saddle-shaped coil assembly 246 such as shown in FIG. 29 is utilized as the high-frequency coil assembly 222.

Figure 31:
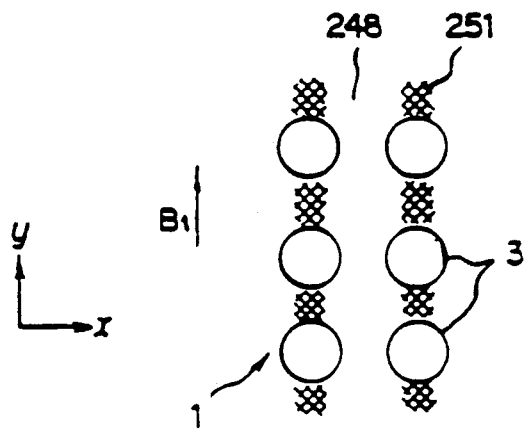
FIG. 31 is an example of an image obtained by the application of a linearly polarized field.

The saddle-shaped coil 246 of FIG. 31 has a structure suitable for the generation of a high-frequency magnetic field $B_1$ oscillating in a y-direction. The high-frequency coil assembly 222 is constructed to carry out impedance matching of 50Ω, for example, for effectively performing the signal receiving and transmitting operations. In the arrangement of FIG. 29, capacitors $C_o$ and $C_1$ are provided for carrying out tuning and matching, respectively. In this embodiment, since the object to be imaged is determined to the fuel assembly 1, it is not necessary to carry out the impedance matching every time of the inspections, and the impedance will be preliminarily adjusted by utilizing a phantom composed of a simulation nuclear fuel assembly and the specific gas filling the container such as shown in FIG. 8.

Figure 30:
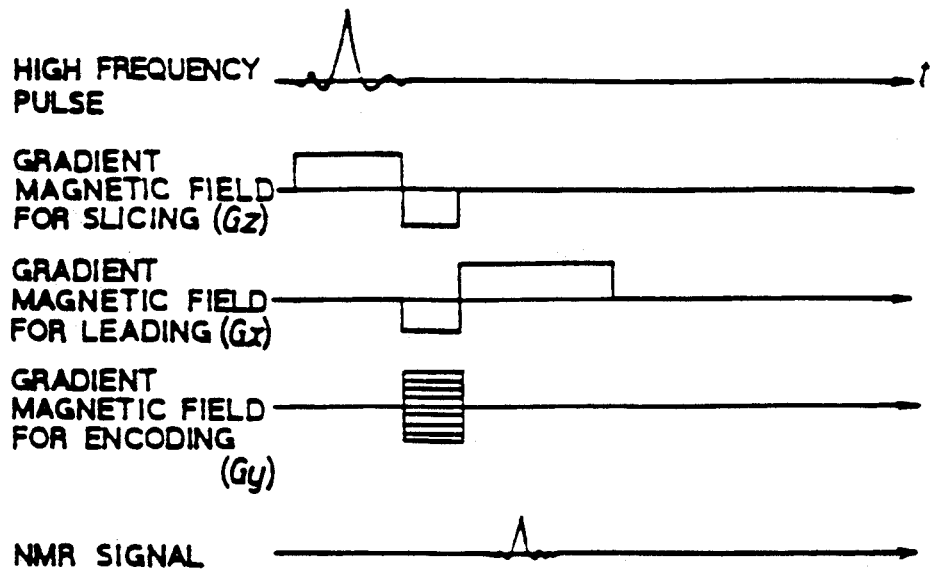
FIG. 30 shows a time chart for the explanatory of the pulse sequence for obtaining data similar to that of FIG. 9.

FIG. 30 shows a time chart representing a pulse sequence in a case where the MR image is actually obtained by utilizing the MRI system. The measuring device 211 is first set in the gas filled chamber in the container 215, and the fuel assembly 1 with the channel box being removed is then inserted into the guide portion 250 of the measuring apparatus 211. Then, the power is applied to the high-frequency coil assembly 222 and the gradient magnetic field generating coil assembly 221 to selectively excite the hydrogen atomic nucleus, having a desired cross section, in the fuel assembly 1. In order to select the slice surface, a high-frequency pulse in which sinc. function is modulated by a magnetic resonance frequency is usually applied to the high-frequency coil assembly 222, and the gradient magnetic field generating coil assembly 221 applies a gradient magnetic field Gz in the form of pulse having a gradient in an axial direction perpendicular to the slice surface. FIG. 30 shows an example in which a cross section perpendicular to the z-axis is selected by applying the gradient magnetic field Gz in the z-direction.

In the next step, the gradient magnetic fields Gx and Gy of two directions crossing with right angle in the cross section perpendicular to the selected z-axis are applied in the form of pulses, thereby generating NMR signals which are to be observed. In the example of FIG. 30, as a leading direction is utilized the x-directional gradient magnetic field Gx, and as an encoding direction is utilized the y-directional gradient magnetic field Gy. One group of sequence shown in FIG. 30 is repeated predetermined several times while changing intensity of the gradient magnetic field GY in the encoding direction. The number of the predetermined times is usually 256 times or 128 times when an MR image of 256×256 matrix, for example, will be obtained.

FIG. 31 shows an example of an MR image having a horizontal section of the fuel assembly 1 obtained in accordance with the sequence of FIG. 31. Referring to FIG. 31, the fuel rod 3 appears as silence, i.e. signal-less, area and the gas such as $CF_4$ 248 filling the gap between the fuel rods 3 appears a high-signal area. The fuel rod 3 has an electric conductivity lower than copper but has a conductivity of about 1/10 of that of copper, and accordingly, the fuel rod 3 attains shielding effects against the high-frequency. Therefore, obliquely crossing line areas 251 in FIG. 31 as shades of the fuel rods 3, in a case where the direction of the high-frequency magnetic field generated by the excitation of the high-frequency coil assembly 222 is the y-direction, appear as slightly dark areas.

Figure 32:
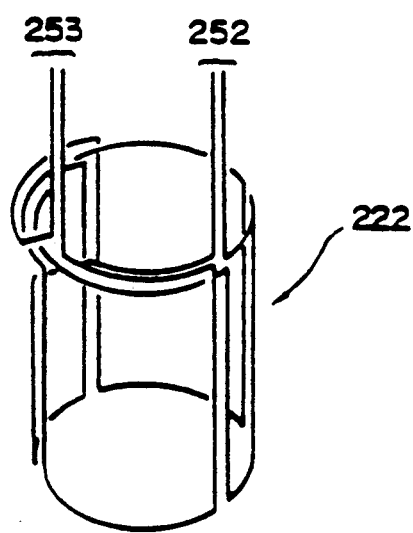
FIG. 32 is an illustration of an example of a high-frequency coil for generating a circularly polarized field, similar to FIG. 11.

In order to suppress such unevenness of the MR image, it will be preferred to utilize a circularly polarized field without utilizing a high-frequency field, i.e. linearly polarized field, oscillating in one direction. FIG. 32 shows one example of a high-frequency coil assembly 222a utilized for generating such circularly polarized field. The high-frequency coil assembly 222a is composed of saddle-type coils 252 and 253, similar to that shown in FIG. 29, which are arranged so as to generate high-frequency magnetic fields having directions crossing at right angle to each other. A substantially circularly polarized field can be generated in the imaging arear inside the coil assembly 222a by applying the same power and high-frequencies having phase difference of 90°, whereby the MR image can be suppressed.

In this embodiment, the duplexer unit 227 has substantially the same structure as that mentioned with respect to the first embodiment such as shown in FIG. 12.

In such operation, signals from both the coils 52 and 53 of the high-frequency coil assembly 222 are added by a voltage and noises are added by an electric power, so that the S/N ratio is increased. For example, signals obtained from the object to be imaged symmetric with respect to the directions of the respective linearly polarized fields have identical signals and noises for the respective coils 52 and 53 and these noises are not related to each other, so that the magnitudes of the NMR signals are made two times, the noises are made about 1.4 times and hence the S/N ratio is improved by about 1.4 times by adding together the phases of the NMR singals.

The operations of the duplexers 254 and 256 are made in a manner such that the duplexer 254 is made ON and the duplexer 256 is made OFF at the signal transmitting time, and on the other hand, the duplexer 254 is made OFF and the duplexer 256 is made ON at the other operation time.

As described hereinbefore, an MR image having substantially even density such as shown in FIG. 13 can be obtained by generating the circularly polarized field by the high-frequency coil assembly 222. In a case where the sectional shape of the object to be imaged has a complicated shape, there is a possibility for obtaining an uneven MR image even if the circularly polarized field is utilized. In such a case, the fuel assembly 1 to be inspected is rotated so as to measure the same from the different angled positions and the thus obtained data is subjected to composite processing by the computer 230, thereby obtaining the even MR image. Otherwise, the signals are discriminated in the binary, i.e. "0, 1", discrimination at the image, processing time, and signals representing positions to which signals are obtained are processed so as to have the same level. In this data processing method, the contrast of the image can be also improved.

It is of course to be noted that the modification of the gap measuring device of the first embodiment, represented by FIG. 3, for example, can be applied to this second embodiment without specific change except for the gas instead of the cooling water.

What is claimed is:

1. A method of measuring a gap between adjoining fuel rods or between a fuel rod and a water rod arranged in a fuel assembly in which the fuel rods and the water rod are arranged in a lattice and supported by spacer means, by a gap measuring apparatus including a gap measuring means utilizing nuclear magnetic resonance, comprising the steps of:
    preparing a container which is filled with a fluid;
    setting the gap measuring means into the fluid in the container;
    placing a fuel assembly to be inspected to a predetermined portion in the container;
    measuring a distribution of the fluid filling in the a fuel assembly set in the container by utilizing a nuclear magnetic resonance; and
    measuring the gap in accordance with the fluid distribution as an image.

2. A method according to claim 1, wherein said fluid is a cooling water.

3. A method according to claim 1, wherein said fluid is a gas.

4. A method according to claim 3, wherein said gas is $CF_4$.

5. An apparatus for measuring a gap between adjoining fuel rods or between a fuel rod and a water rod arranged in a fuel assembly in which the fuel rods and the water rod are arranged in a lattice and supported by spacer means, by utilizing nuclear magnetic resonance, comprising:
    measuring means set in a container which is filled with a fluid, said measuring means including a magnet means and a coil means for generating magnetic fields, said coil means including a coil assembly for generating gradient magnetic field and a coil assembly for generating high-frequency and detecting a nuclear magnetic resonance signal;
    a control means for controlling the magnetic fields generated by the respective magnet means and coil assemblies; and
    a data processing means for carrying out data processing in response to a signal transmitted from the control means, wherein distribution of the fluid in the fuel assembly set in the container is processed as a sectional image of the fuel assembly to thereby measure the gap between adjoining fuel rods or between the fuel rod and the water rod.

6. An apparatus according to claim 5, wherein said control means includes a power source for exciting the coil means for generating the magnetic field and a duplexer unit through which high-frequency power is applied to the coil assembly for generating the high-frequency.

7. An apparatus according to claim 5, wherein said data processing means includes a sequence controller operatively connected to the control means, a data storage unit connected to the control means, a computer connected to the data storage unit and an image display unit for displaying an image processed by the computer.

8. An apparatus according to claim 5, wherein said measuring means includes a cylindrical magnet provided with a coil in the form of a solenoid for generating a static magnetic field and further includes cable means comprising a cable for driving the magnet, a cable for driving a magnetic field adjusting coil assembly, a cable for driving the gradient magnetic field generating coil assembly and a cable for driving the high-frequency coil assembly.

9. An apparatus according to claim 8, further including a duct means for supplying a cooling medium for cooling the magnet.

10. An apparatus according to claim 9, wherein said duct means is covered by a heat insulation material.

11. An apparatus according to claim 8, wherein said gradient magnetic field generating coil assembly is disposed inside the cylindrical magnet and generates a gradient magnetic field having primary gradients in three directions crossing with right angles to each other.

12. An apparatus according to claim 8, wherein said coil assemblies for adjusting the magnetic field, generating the gradient magnetic field and generating the high-frequency are disposed, respectively, inside the magnet and fixedly covered by a resin material for preventing said coil assemblies from directly contacting the fluid in the container.

13. An apparatus according to claim 12, wherein the resin material covering the high-frequency coil assembly has a small dielectric dissipation factor.

14. An apparatus according to claim 5, wherein the coil assembly for generating the high-frequency is comprised of a saddle-shaped coil assembly for applying in shape of pulses a high-frequency with which a hydrogen atomic nucleus is magnetically resonated in the static magnetic field in a direction perpendicular to the static magnetic field and for detecting a nuclear magnetic resonance signal.

15. An apparatus according to claim 14, wherein the high-frequency coil assembly is subjected to impedance matching by means of a capacitor.

16. An apparatus according to claim 5, wherein the high-frequency coil assembly is comprised of saddle-shaped coils arranged so that high-frequency generated by the coils cross each other at a right angle for generating a circularly polarized field.

17. An apparatus according to claim 5, wherein said measuring means comprises a magnet for generating a static magnetic field, a coil assembly disposed inside the magnet for generating gradient magnetic field and a coil assembly for generating high-frequency and receiving a nuclear magnetic resonance signal, wherein the magnet generates the static magnetic field in a direction substantially perpendicular to an axial direction of the fuel assembly set in the container, the gradient magnetic field generating coil assembly generates gradient magnetic fields in two directions crossing at right angles to each other in a plane crossing substantially at a right angle to the axial direction of the fuel assembly, and the high-frequency coil assembly generates a high-frequency in a direction substantially parallel to the axial direction of the fuel assembly.

18. An apparatus according to claim 17, wherein said magnet is a permanent magnet.

19. An apparatus according to claim 17, wherein said parmanent magnet has a substantially C-shaped structure and comprises a pair of magnet pieces disposed at opposing end faces thereof and a ferromagnetic body connecting the magnet pieces in an integral structure and wherein hole pieces are disposed at opposing end faces of the magnet pieces.

20. An apparatus according to claim 17, wherein the gradient magnetic field generating coil assembly is of an Anderson-type coil assembly adapted to generate a gradient magnetic field having primary gradients parallel to the static magnetic field in three directions crossing at right angles to each other.

21. An apparatus according to claim 17, wherein said coil assemblies for generating the gradient magnetic field and generating the high-frequency magnetic field are disposed, respectively, inside the magnet and fixedly covered by a resin material for preventing said coil assemblies from directly contacting the fluid in the container.

22. An apparatus according to claim 21, wherein the resin material covering the high-frequency coil assembly has a small dielectric dissipation factor.

23. An apparatus according to claim 17, wherein the coil assembly for generating the high-frequency is comprised of a saddle-shaped coil assembly for applying in the shape of pulses a high-frequency with which a hydrogen atomic nucleus is magnetically resonated in the static magnetic field in a direction perpendicular to the static magnetic field and for detecting a nuclear magnetic resonance signal.

24. An apparatus according to claim 23, wherein the high-frequency coil assembly is subjected to impedance matching by means of capacitor.

25. An apparatus according to claim 17, wherein the high-frequency coil assembly is comprised of saddle-shaped coils arranged so that high-frequency generated by the coils cross each other at a right angle for generating a circularly polarized field.

26. An apparatus according to claim 17, wherein said magnet is an electromagnet.

27. An apparatus according to claim 26, wherein said electromagnet has a substantially C-shaped structure and comprises a C-shaped ferromagnetic body and a coil wound around the magnetic ferromagnetic body.

28. An apparatus according to claim 17, wherein said magnet is a Helmholtz-type magnet.

29. An apparatus according to claim 5, wherein the fluid is a cooling water filling the container.

30. An apparatus according to claim 5, wherein the fluid is a gas filling the container.

31. An apparatus according to claim 30, wherein the gas is a $CF_4$ gas.

* * * * *